(12) United States Patent
Tamura et al.

(10) Patent No.: US 8,042,021 B2
(45) Date of Patent: *Oct. 18, 2011

(54) MEMORY CARD AND MEMORY CONTROLLER

(75) Inventors: Takayuki Tamura, Higashiyamato (JP); Hirofumi Shibuya, Tokyo (JP); Hiroyuki Goto, Higashimurayama (JP); Shigemasa Shiota, Tachikawa (JP)

(73) Assignees: Renesas Electronics Corporation, Kawasaki-shi (JP); Hitachi ULSI Systems Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/089,310

(22) Filed: Apr. 18, 2011

(65) Prior Publication Data

US 2011/0197108 A1    Aug. 11, 2011

Related U.S. Application Data

(63) Continuation of application No. 11/861,190, filed on Sep. 25, 2007, now Pat. No. 7,954,039, which is a continuation of application No. 11/504,016, filed on Aug. 15, 2006, now Pat. No. 7,290,198, which is a continuation of application No. 10/083,502, filed on Feb. 27, 2002, now Pat. No. 7,114,117.

(30) Foreign Application Priority Data

Aug. 9, 2001    (JP) .................................. 2001-241930

(51) Int. Cl.
*G11C 29/00*    (2006.01)
*G11C 16/04*    (2006.01)
*G06F 12/00*    (2006.01)

(52) U.S. Cl. .................... 714/763; 365/185.11; 711/168
(58) Field of Classification Search .................. 714/763; 365/185.11; 711/168
See application file for complete search history.

(56) References Cited

U.S. PATENT DOCUMENTS

| | | | |
|---|---|---|---|
| 5,341,489 | A | 8/1994 | Heiberger et al. |
| 5,640,349 | A | 6/1997 | Kakinuma et al. |
| 5,761,732 | A | 6/1998 | Shaberman et al. |
| 6,141,249 | A | 10/2000 | Estakhri et al. |
| 6,202,138 | B1 | 3/2001 | Estakhri et al. |
| 6,426,893 | B1 | 7/2002 | Conley et al. |
| 7,114,117 | B2 | 9/2006 | Tamura et al. |
| 7,290,198 | B2 | 10/2007 | Tamura et al. |

FOREIGN PATENT DOCUMENTS

| | | |
|---|---|---|
| JP | 6-342399 A | 12/1994 |
| JP | 7-36787 A | 2/1995 |
| JP | 9-288618 A | 11/1997 |
| JP | 10-187359 A | 7/1998 |
| JP | 2001-134496 A | 5/2001 |

*Primary Examiner* — John J Tabone, Jr.
(74) *Attorney, Agent, or Firm* — Miles & Stockbridge P.C.

(57) ABSTRACT

A memory card has a plurality of non-volatile memories and a main controller for controlling the operation of the non-volatile memories. The main controller performs an access control to the non-volatile memories in response to an external access instruction, and an alternate control for alternating an access error-related storage area of the non-volatile memory with other storage area. In the access control, the speeding up of the data transfer between flash memories is achieved by causing the plurality of non-volatile memories to parallel access operate. In the alternation control, the storage areas is made alternative for each non-volatile memory in which an access error occurs.

2 Claims, 21 Drawing Sheets

MEMORY CARD AND MEMORY CONTROLLER

CROSS-REFERENCE TO RELATED APPLICATION

This application is a continuation of application Ser. No. 11/861,190 filed Sep. 25, 2007 now U.S. Pat. No. 7,954,039, which is a continuation of application Ser. No. 11/504,016 filed Aug. 15, 2006 (now U.S. Pat. No. 7,290,198), which is a continuation of application Ser. No. 10/083,502 filed Feb. 27, 2002 (now U.S. Pat. No. 7,114,117).

BACKGROUND OF THE INVENTION

The present invention relates to a memory card having a non-volatile memory mounted thereon, and a memory controller which is applied to a non-volatile memory card, and in particular to a technology which is effective to apply to a memory card having a hard disc compatible flash memory mounted thereon.

A memory card using an electrically erasable and writable non-volatile memory such a flash memory comprises a non-volatile memory and a memory controller which performs an access control for the memory and an external interface control, which are mounted on a card substrate. Although the number of bits of data transferred between the non-volatile memory and the memory controller may be equal to the number of bits of data of the input and output of the non-volatile memory, the efficiency of the data transfer may be low. Accordingly, it is possible to connect a plurality of non-volatile memories to a memory controller in parallel for increasing the number of parallel bits of data to be transferred. Prior art which focuses on this includes a parallel-writing technique disclosed in JP-A-6-342399 and JP-A-7-36787, and an interleave-writing technique for two flash memories which is disclosed in JP-A-10-187359.

The present inventors have searched a parallel access technique using a plurality of non-volatile memories. The first matter which has been considered is a relation between the storage areas and the alternate control function when an access error has occurred. When an access error such as write error has occurred in, for example, a hard disc compatible memory disc, the alternation (substitution) of storage areas is performed in unit of sector. If the alternation is performed in unit of sector when data of one sector is distributed over a plurality of non-volatile memories, the storage area of a flash memory in which no writing error has occurred may be alternated. This wastes the storage area of the non-volatile memories, resulting in a shortened period of time which is taken for the memory to become non-alternative.

The second matter which has been considered is a relation between the operation of the memory and an error detecting and correction operation which is performed by an ECC and the like. A technique like ECC usually performs addition of an error detection code to write data, and error detection and correction for read data. It has been found from the study of such an error detection and correction that only parallel access to non-volatile memory by the memory controller is insufficient. Even when data is read at a high rate by a memory controller accessing to the plurality of non-volatile memories in a parallel manner, speeding up of access as a whole of a memory card could not be achieved unless the operation of the ECC circuit which conducts the error detection and correction for the read data follow the parallel access operation and/or unless the generation of an error detection code to be added to write data is not fast.

SUMMARY OF THE INVENTION

It is an object of the present invention to achieve the speeding up of the access in a memory card using an non-volatile memory.

The foregoing and other objects and novel advantage of the present invention will become apparent from the description of the specification and the annexed drawings.

Typical features of the invention which will be disclosed herein are as follows:

(1) A memory card according to the present invention has a plurality of non-volatile memories, and a memory controller for controlling the operation of the non-volatile memories. The memory controller performs an access control of the non-volatile memories in response to an external access instruction, and an alternation control for alternating a storage area of an access error-related non-volatile memory with other storage area.

At this time, the memory controller firstly causes the plurality of non-volatile memories to parallel-access operate in the access control. For example, assuming first and second non-volatile memories as two non-volatile memories, the memory controller allocates the first non-volatile memory to storage areas for even data of sector data, and allocates the second non-volatile memory to storage areas for odd data of the sector data. In the parallel access operation, the memory controller causes the first and second non-volatile memories to operate for reading and writing in a parallel manner. Parallel accessing to the plurality of non-volatile memories by the memory controller means that the width of data bus or the number of data-transfer parallel bits between the memory controller and a flash memory is large. This achieves speeding up of the data transfer between the memory controller and the flash memory.

Secondarily, in the alternation control, the memory controller makes the storage area alternative for each non-volatile memory in which an access error has occurred. Briefly, each of a plurality of non-volatile memories is provided with address management information for the alternation control. For example, when an access error occurs in even data of a sector data, the storage area of the even data in the first non-volatile memory is alternated with other memory address, and original memory address is allocated to odd data in which no access error has occurred. Since area management for the alternation control of the plurality of non-volatile memories is carried out in unit of non-volatile memory, alternate areas for defective address can be effectively used, and waste use of the storage area can be reduced for alternation, which contributes to extension of the service life of the memory card. In brief, if alternation in unit of sector data is conducted when one sector data is distributed over a plurality of non-volatile memories, an alternate sector address could be consumed in each non-volatile memory. Such waste is prevented by the present invention.

Thirdly, the memory controller causes the operation of EEC circuit to follow an enhancement in the data transfer efficiency between the memory controller and the non-volatile storage device. That is, the ECC circuit which is provided in the memory controller is adapted to perform an input/output operation which is in parallel with the parallel access operation of the non-volatile memory at an operation frequency which is the input/output operation frequency of the non-volatile memories, which is multiplied with the number of parallel operations of the non-volatile memories. This achieves speeding up of the generation of the error detection code and the error detection and correction without increasing the hardware of the ECC circuit.

If ECC circuits are provided which are as many as the number of the parallel access operations, the input/output operations is only required to operate in a parallel manner at an operation frequency which is equal to the input/output operation frequency of the non-volatile memories which are in parallel accessed without increasing the operation frequency of the ECC circuit.

When the memory controller reads data at a high rate by in parallel accessing to the plurality of non-volatile memories, the operation of the ECC circuit which performs error detection and correction for the read data can follow the reading of data. Since the generation of an error detection code to be added to write data can be speeded up, speeding up of accessing which is achieved as a whole of the memory card can be implemented.

(2) A memory controller according to the present invention has a host interface circuit which can perform the input and output operations in accordance with a predetermined protocol, a memory interface circuit which can be connected to a plurality of non-volatile memories in parallel, and a control circuit which is connected to the host interface circuit and the memory interface circuit. The control circuit performs an external interface control via the host interface circuit, an access control of the non-volatile memories via the memory interface circuit responsive to an external access instruction, and an alternation control for alternating an storage area of non-volatile memory, which is related to an access error, with other storage area. Firstly, the control circuit causes the plurality of non-volatile memories to operate for parallel access in the access control. This achieves the speeding up of the data transfer between the non-volatile memories. Secondarily, in the alternation control, the storage area is made alternative for each non-volatile memory in which the access error occurs. This reduces the waste of the storage area on the alternation thereof and contributes to extension of the service life of the non-volatile storage device. Thirdly, since the operation of the ECC circuit can follow to improve the efficiency of the data transfer between the control circuit and the non-volatile storage device, the generation of an error detection code and the error detection and correction can contribute to the implementation of the high rate access which is achieved by the whole of the memory card.

(3) A memory card according to another aspect of the present invention has a control circuit, a plurality of non-volatile memories, and an external interface circuit which is connected to an external device, and a bus. The plurality of non-volatile memories have a plurality of input/output terminals (I/O 0 to I/O 7). The bus has a first bit width, is divided into the sets of the predetermined number of bits, and is connected to the input/output terminals of the corresponding one of the non-volatile memories. The control circuit is adapted to conduct the control of an access to the plurality of non-volatile memories, and performs the address alternating processing for each of the non-volatile memories when an access error occurs in an access to the non-volatile memories. This provides effects and advantages similar to those which are provided by the first point (i.e., the parallel access to the plurality of non-volatile memories) and the second point (i.e., the alternation in unit of memory mentioned).

A memory card according to another aspect of the present invention has a control circuit (41, 42 and 43), a plurality of non-volatile memories, n (n is integer which is one or more) error detection and correction circuits, and a bus. The control circuit is adapted to perform an access control to the plurality of non-volatile memories. Each of the non-volatile memories has input/output terminals with a first bit width W1, and is accessible at an access frequency F1. The bus has a bit width of (W1×m), and is connected to the input/output terminals of m non-volatile memories in parallel. The error detection and correction circuit can detect and correct an error of data with a bit width W2. An operation frequency F2 of the error detection and correction circuit satisfies the following relation.

$$F2 \geq (F1 \times W2 \times m)/(W2 \times n)$$

This provides effects and advantages similar to those which are provided by the third point (i.e., the operation of the ECC circuit is followed to improvement the efficiency of the data transfer between the memory card and the non-volatile storage device.

A memory controller according to another aspect of the present invention has a control circuit (41, 42 and 43), an input/output terminal with a first bit width (the input/output terminal connected to 12 and 13), and one or more error detection and correction circuits. The error detection and correction circuits are adapted to conduct error correction of data which is inputted and outputted via the input/output terminal. The control circuit has an address alternating capability, and is adapted to control the input/output of data via the input/output terminal. When an access error has occurred in the input/output of data at an address, the control circuit divides the input/output terminal into groups each having a second bit width, to perform the address alternation in the group in which the access error has occurred. This provides effects and advantages similar to those which are provided by the first point (i.e., the parallel access to the plurality of non-volatile memories) and the second point (i.e., the alternation in unit of memory).

DETAILED DESCRIPTION OF THE EMBODIMENTS

Figure 1:
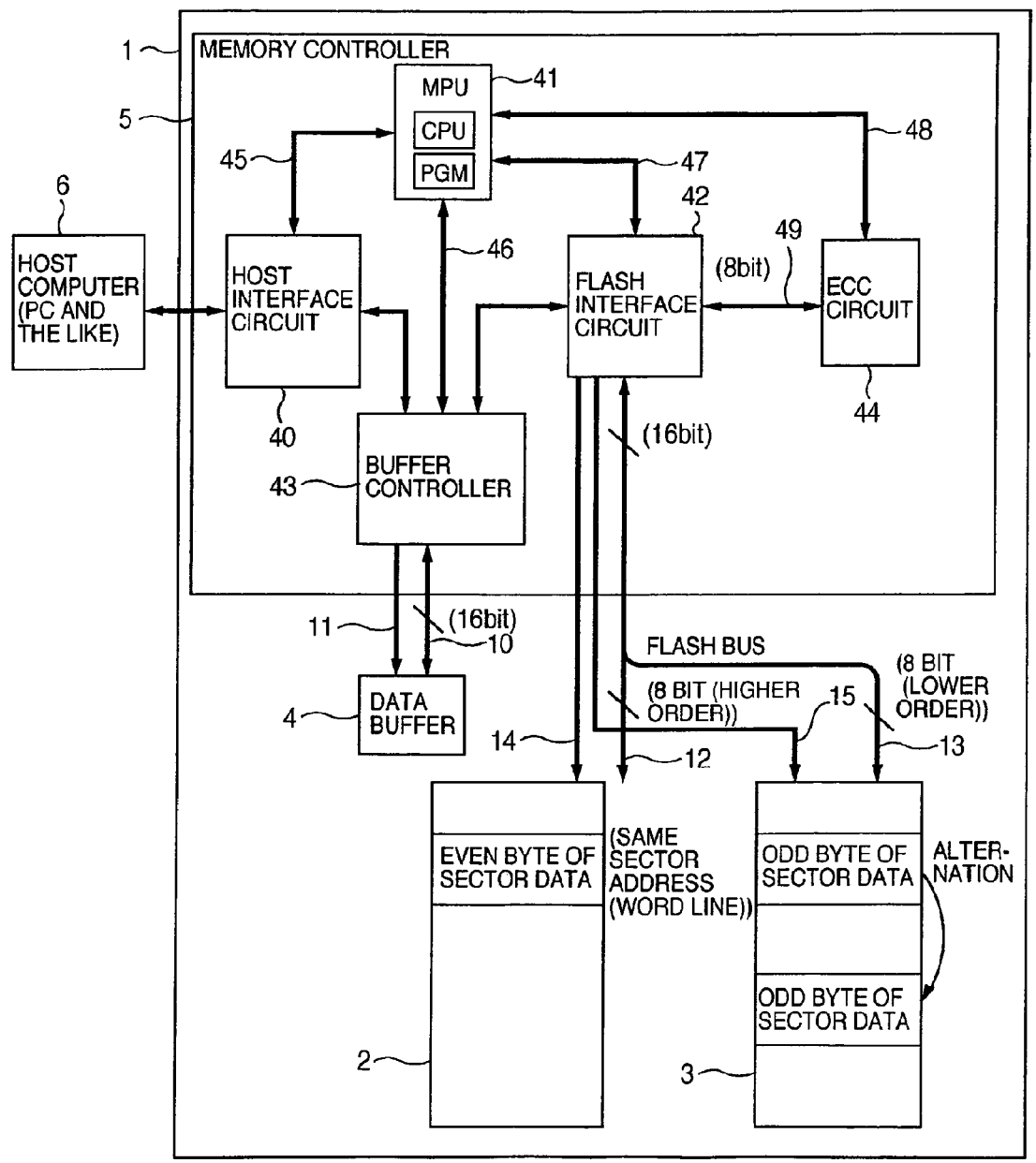
FIG. 1 is a block diagram showing an embodiment of the memory card of the present invention.

An exemplary memory card of the present invention is illustrated in FIG. 1. The memory card 1 comprises a plurality of non-volatile memories such as two flesh memories 2 and 3, a data buffer 4 including DRAMs (Dynamic Random Access Memories) or SRAMs (Static Random Access Memories) and the like and a memory controller 5 for controlling the memories and an external interface, which are mounted on a substrate.

The above-mentioned data buffer 4 is subjected to access control by the memory controller 5 via a 16-bit data input/output buffer bus 10 and an address and access control bus 11, but is not limited to this control.

The flash memory 2 is connected to high order 8-bits (high order flash busses) 12 of the 16-bit input/output flash bus and the flash memory 3 is connected to low order 8-bits (low order flash busses) of said flash bus, so that the input and/or output of the data, address signal and command to and from the memory controller 5 is made possible. Reference numerals 14 and 15 denote access control busses which are separately connected to the flash memories 2 and 3 from the memory controller 5. Parallel access to the flash memories 2 and 3 is made possible via respective flash busses 12 and 13 and access control busses 14 and 15 by the memory controller 5.

Chip select signal, command enable signal, output enable signal and the like are transmitted to the access control busses 14 and 15. It is possible to make the strobe signal of the output enable signal and the like common between the flash memories 2 and 3.

Figure 2:
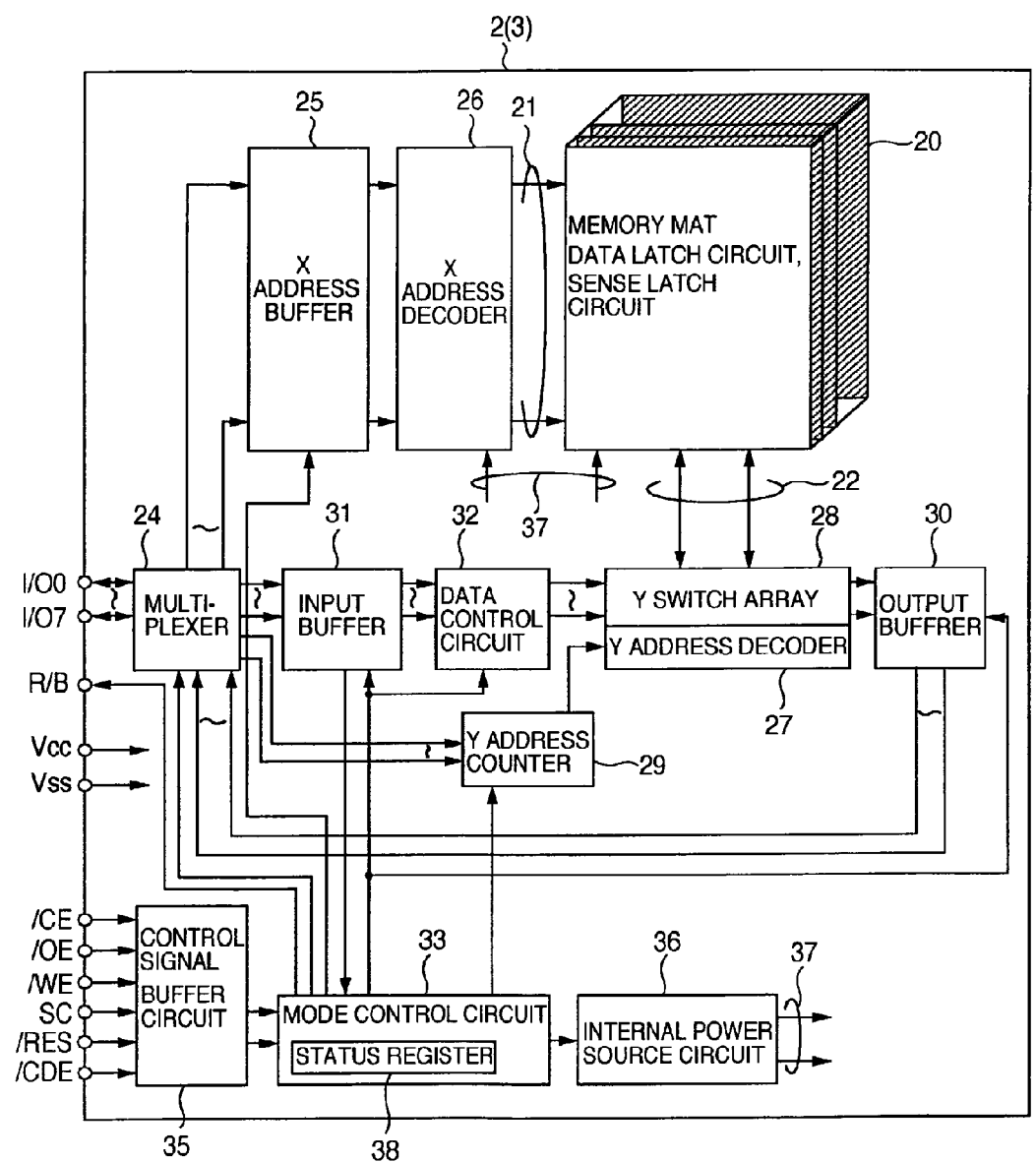
FIG. 2 is a block diagram showing an embodiment of flash memories.

The flash memories 2 and 3 have identical circuit configuration. An exemplary flash memory 2 is illustrated in FIG. 2. In the drawing, the memory array 20 has a memory mat, data latch circuit and sense latch circuit. The memory mat has a multiplicity of electrically erasable and writable non-volatile memory cell transistors. Memory cell transistors (also referred to as flash memory cells) each comprise a source; drain which are formed in a semiconductor substrate or well; a floating gate which is formed in channel regions between said source and drain via a tunnel oxide film; and a control gate superposed on the floating gate so that an interlayer insulating film is disposed therebetween although they are not specifically shown. The control gate, drain and source are connected to corresponding word line 21, bit line 22 and source line (not shown), respectively. The memory cell transistors have a threshold voltage which increases or decreases when electrons are injected to or removed from said floating gate. The memory cell transistors are adapted to store information depending upon the level of the threshold voltage with respect to the voltage (voltage applied to the control gate) of the word lines for reading data. Herein the states in which the threshold of the memory cell transistors is low and high are referred to as "erase state" and "write state", respectively, although not limited thereto. Since the definition of writing and reading is relative, the reverse definition is possible.

External input/output terminals I/O 0 through I/O 7 are commonly used as address input, data input, data output and command input terminals. An X address signal which is input from the external input/output terminals I/O 0 through I/O 7 is applied to an X address buffer 25 via a multiplexer 24. An X address decoder 26 decodes an internal complimentary address signal output from the X address buffer 25 for driving the word lines 21.

Each of the bit lines 22 is provided at one end thereof with a sense latch circuit and at the other end with a data latch circuit. Any of the bit lines 22 is selected by a Y switch array 28 in response to a selection signal output from the Y address decoder 27. An input Y address signal from the external input/output terminals I/O 0 through I/O 7 is preset by an Y address counter 29 so that the address signal which is consecutively incremented from a preset value is provided to the Y address decoder 27.

The bit line which is selected by the Y switch array 28 is brought into conductive to the input terminal of the output buffer 30 in data output operation and to the output terminal of the data control circuit 32 via an input buffer 31 in data input operation. Connection between the output and input buffers 30 and 31 and said input/output terminals I/O 0 through 7 is controlled by the multiplexer 24. The command from the input/output terminals I/O 0 through 7 is provided to a mode control circuit 33 via the multiplexer 24 and the input buffer 31.

A control signal buffer circuit 35 is adapted to input a chip enable signal/CE, output enable signal 10E, write enable signal/WE, serial clock signal SC, reset signal/RES and command enable signal /CDE as access control signal. A reference "/" which is annexed immediately before the signal designation represents that the signal in interest is a low enable signal. The mode control circuit 33 is adapted to control a function of signal interface with external devices which is performed via the multiplexer 24 depending upon the state of the signal. The command input from the input/output terminals I/O 0 through 7 is synchronized with the command enable signal/CDE. The data input is synchronized with the serial clock signal SC. The input of the address information is synchronized with the write enable signal/WE. When initiation of erasure and writing is instructed with a command code, the mode control circuit 33 asserts a ready-busy signal R/B representative of erasing and writing operation during the period of time to externally output it.

An internal power source circuit (internal voltage generating circuit) 36 generates various internal voltages for writing; erasing, verification and reading to supply them to the X address decoder 26 and the memory cell array 20, etc.

The mode control circuit 33 controls all of the flash memories in accordance with an input command. The operation of the flash memory 2 is basically determined by commands. The commands of the flash memory 2 include read command code, read X address and necessary Y address. The write commands include write command code, X address, necessary Y address and write data.

The flash memory 2 has a status register for representing its inner status. The content of the memory is rendered readable from the input/output terminals I/O 0 to I/O 7 by asserting the signal/OE.

In FIG. 1, the memory controller 5 conducts external interface control between the memory and, for example, host computer (host device) 6, which complies with IDE interface specifications, etc. The memory controller 5 has an access control function for accessing to the flash memories 2 and 3 in accordance with an instruction from the host computer. The access control function is a hard disc compatible control function. For example, when the host computer 6 manages a set of the sector data as a file data, the memory controller 5 conducts the access control for the flash memories 2 and 3 by causing the sector address which is a logical address to correspond to the physical address. At this time, the memory controller 5 allocates the flash memories 2 and 3 to the storage areas of even and odd data of the sector data, respectively. The memory controller 5 causes the flash memories 2 and 3 to conduct parallel reading and writing operations. The parallel access control function of the main controller 5 increases the width of the data bus and the number of the bits of the data transferred between the memory controller 5 and the flash memories 2 and 3 so that speeding up of the data transfer the controller and the flash memories can be achieved. Addition of an error code to the data, to be written, detection and correction of error for the read data is performed by EEC function when the flash memory 2 is accessed in accordance with the access control function. If an failure to erase or write (an access error) is found by the verify operation when erasure and writing is performed to the flash memories 2 and 3 in accordance with the above-mentioned access control function, an alternate control function to alternate the defective area in interest with an alternate area would be performed.

As shown in FIG. 1, the memory controller 5 comprises a host interface circuit 40, a microprocessor (MPU) 41 which is operation control means, flash interface circuit serving as memory interface circuit, buffer controller 43 and ECC circuit 44. The MPU 41, buffer controller 43 and ECC circuit 44 constitute a control circuit for the memory controller 5.

The MPU 41 has a CPU (Control Processing Unit) and its program memory (PGM) and generally controls the memory controller 5. The program memory possesses an operation program for the CPU, etc.

The host interface circuit 40 interfaces between the memory system and the host computer 6 such as personal computer or workstation in accordance with a predetermined protocol such as ATA (AT Attachment), IDE (Integrated Device Electronics), SCSI (Small Computer System Interface), etc. Control for the host interface operation is conducted via an access bus 45 by the MPU 41. Since the protocol is known, detailed description thereof will be omitted.

The buffer controller 43 controls the memory access operation of the data buffer 4 in accordance with an access instruction which is provided via an access bus 46 from the MPU 41. The data which is input to the host interface circuit 40 or the data which is output from the host interface circuit 40 is temporarily held in the data buffer 4. The data which is read from the flash memories 2 and 3 or the data which will be written in the flash memories 2 and 3 is temporarily held in the data buffer 4.

The flash interface circuit 42 controls read, erasure and write operation for the flash memories 2 and 3 in accordance with access instructions which are provided via the access bus 47 from the MPU 41. The flash interface circuit 42 outputs read control information such as read command code and read address information in read operation and outputs write control information such as write command code and write address information in write operation and outputs erasure control information such as erasure command, etc. in erasure operation. As mentioned above, the flash interface circuit 42 performs the access operation of read and write for the flash memories 2 and 3 in a parallel manner. Briefly, it performs inputting of read data and outputting of write command code and write data via the flash busses 12 and 13 at a width of 16 bits.

The ECC circuit 44 generates an error correction code for data to be written in the flash memories 2 and 3, and adds it to the write data in accordance with an instruction provided via the access bus 48 from the MPU 41 as one of the access control functions. The ECC circuit 44 also conducts an error detection and correction by using the error correction code which has been added to the read data read from the flash memories 2 and 3 to perform a correction for an error within the ability of the error correction. The flash interface 42 and ECC circuit 44 conduct data transmission via an 8-bit data bus 49. The ECC circuit 44 conducts input/output operation at a frequency which is higher by a factor of the number of parallel access operations, or is double as high as the input/output operation frequency of the flash memories 2, 3 which are in parallel accessed in order to follow the processing capacity which is achieved by both flash memories 2 and 3 conducting parallel data transfer at 16 bit width. This makes it possible to cope with the speeding up of the data access which is achieved via the flash busses 12 and 13 without increasing the hardware of the ECC circuit 44. This results in an increase in speed of the processing for generation of error detection code and error detection and correction.

Figure 3:
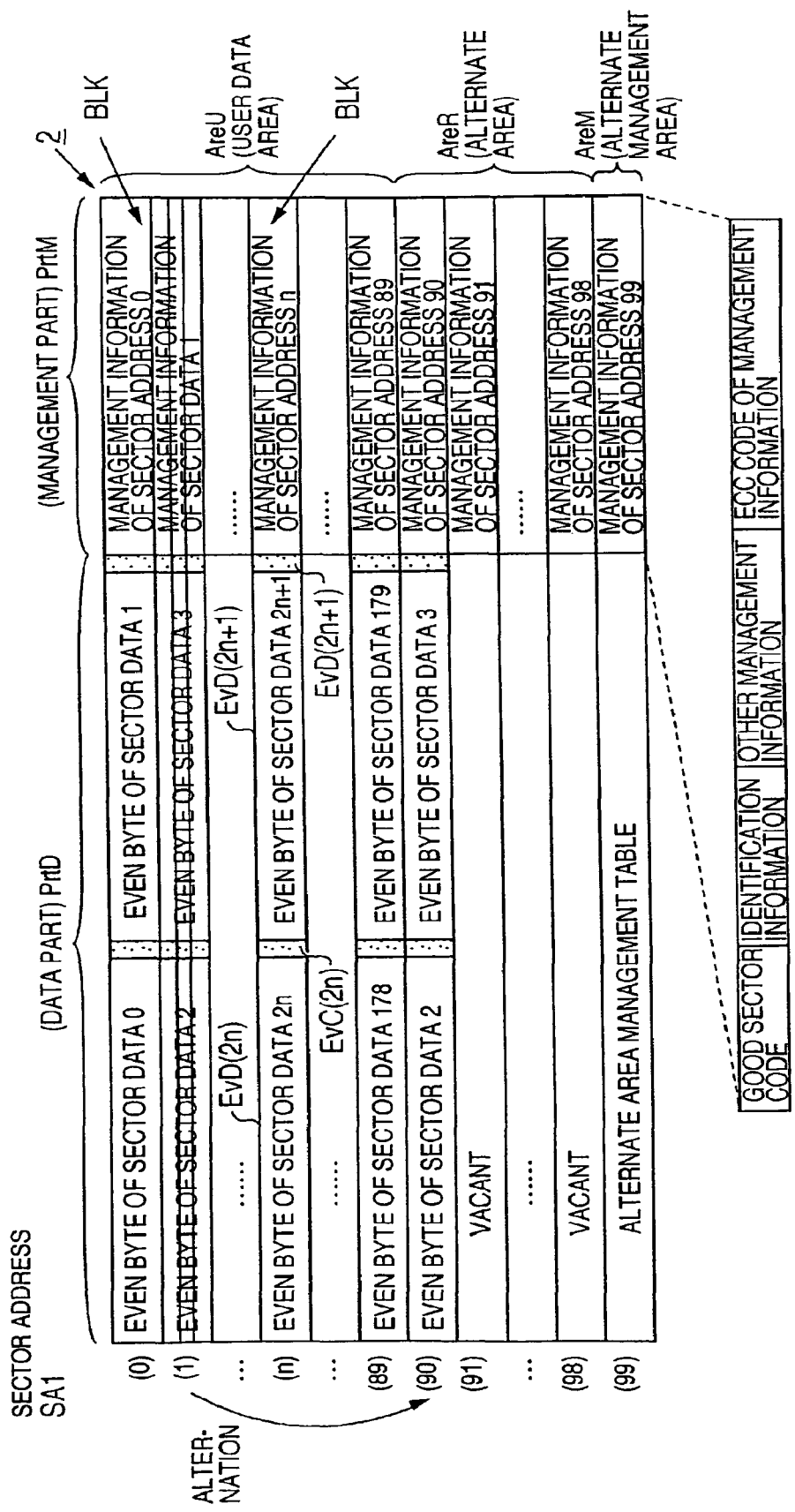
FIG. 3 is an explanatory view exemplarily showing the storage area of one of the flash memories.
Figure 4:
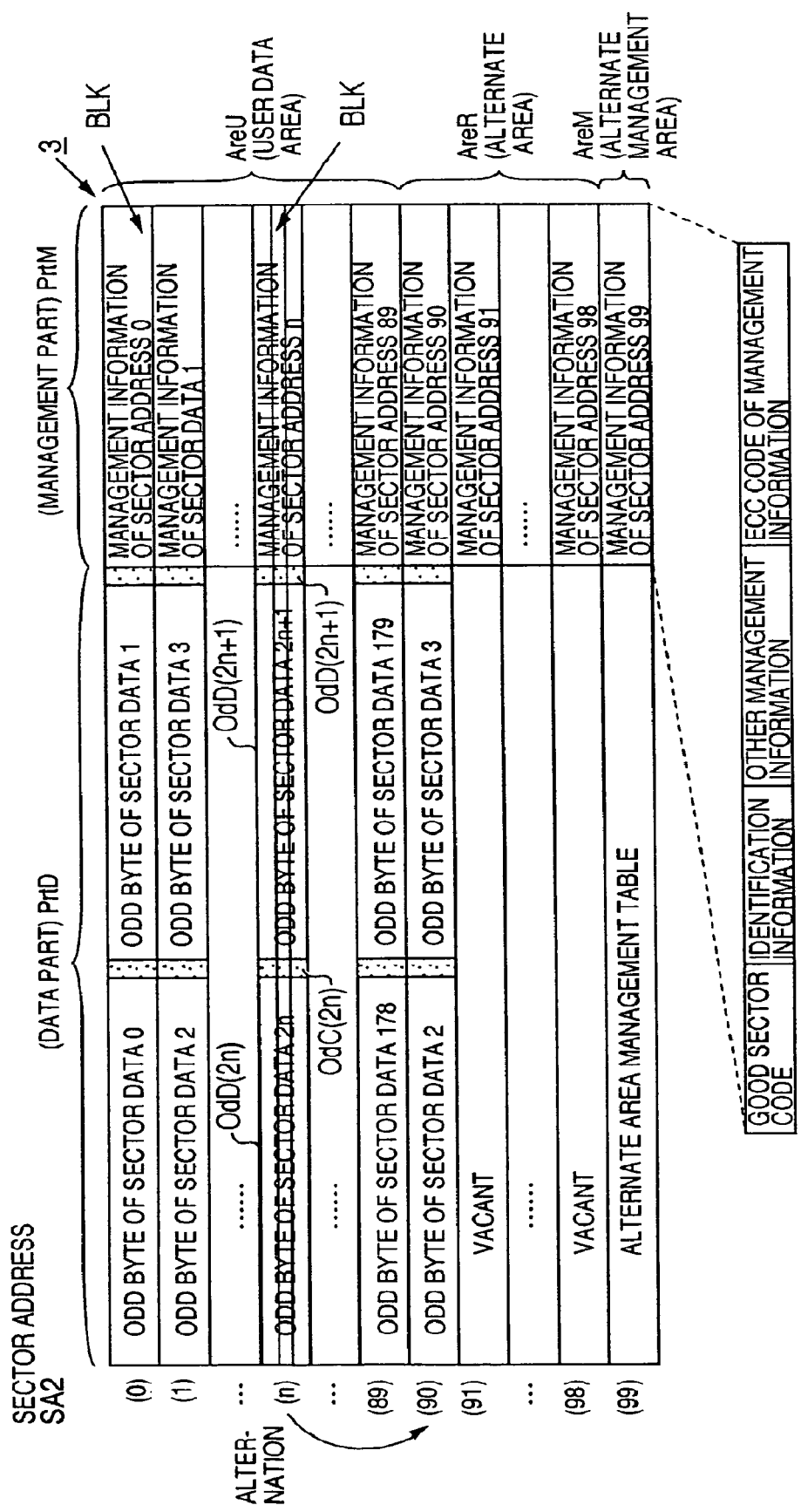
FIG. 4 is an explanatory view exemplarily showing the storage area of other flash memories.

Exemplary storage areas of the flash memories 2 and 3 are illustrated in FIGS. 3 and 4, respectively. Each of storage areas of the flash memories 2 and 3 is mainly divided into a user data area AreU, alternate area AreR and alternate management area AreM. Each of area AreU, AreR and AreM has an unit area BLK having an area of a predetermined format, which is mainly divided into a data part PrtD and management part PrtM. A sector address SA1 (SA1(0) through SA1(99)) is allocated to each unit area BLK of the flash memory 2 as its physical address for convenience. A sector address SA2 (SA2(0) through SA2(99)) is allocated to each unit area BLK of the flash memory 3 as its physical address for convenience.

The user data area AreU is, for example, a data area which is opened to users. The data part PrtD of the flash memory 2 holds even numberth byte data of the sector data as exemplarily shown in FIG. 3. The data part PrtD holds odd byte data of the sector data as exemplarily shown in FIG. 4. When an erasure error or write error occurs at the user data area AreU with the lapse of time, the above-mentioned alternate area AreR is used so that the unit area BLK of the user data area AreU at which an error occurs is replaced therewith. A minimum unit for alternation is the unit area BLK.

For example, in the flash memory 2 of FIG. 3, the data part PrtD of the sector address SA1 contains even byte data of the sector data $2n$ (even byte data in each byte data of, for example 512 bytes) EvD ($2n$), ECC code EvC (n2) as an error detection code relating to even byte data of the sector data $2n$, even byte data of the sector data $2n+1$ (even 256 byte data in each byte data in each byte data of, for example 512 bytes) EvD ($2n+1$), and an ECC code EvC ($2n+1$) as an error detection code relating to even byte data of the sector data $2n+1$. The management part PrtM of the sector address SA1 ($n$) has a good sector code, identification information, other management information and ECC code as management information of the sector address n. The good sector code is a code data representative of whether the sector address SA1 (*n*) is good or not. The identification code is a code data representative of which of the user data, alternated area, vacant area, or alternate area management area, the corresponding data part belongs to. The other management information may not be particularly defined. The ECC code is error detection and correction redundancy information for good sector code, identification information and other management information.

In the flash memory 3 of FIG. 4, the data part PrtD of the sector address SA2 (*n*) contains odd byte data of the sector data 2*n* (odd 256 byte data in each byte data of, for example, 512 bytes) OdD (2*n*), ECC code EvC (2*n*) as the error detection code relating to odd byte data of the sector data 2*n*, odd byte data of the sector data 2*n*+1 (odd 256 byte data in each byte data of, for example, 512 bytes), OdD (2*n*+1) and ECC code OdC (2*n*+1) as the error detection code relating to odd byte data of the sector data 2*n*+1. The management information which the management part PrtM of the flash memory 3 possesses has meaning which is similar to that of the flash memories of FIG. 3.

Figure 5:
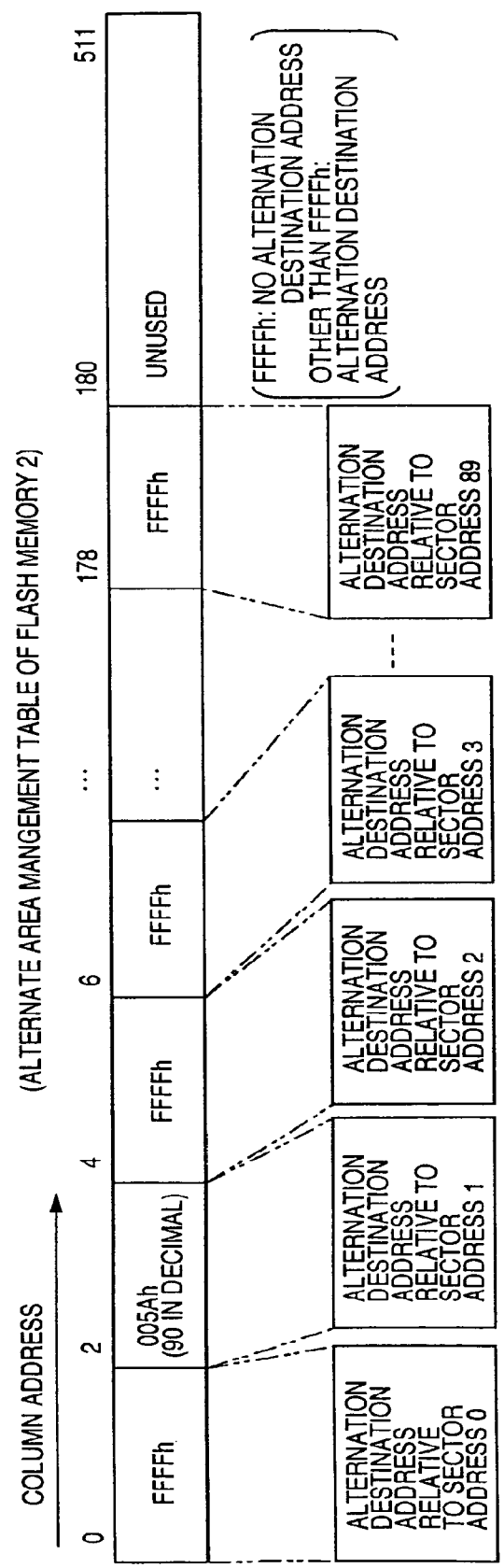
FIG. 5 is an explanatory view exemplarily showing the alternate area management table in one of the flash memories.
Figure 6:
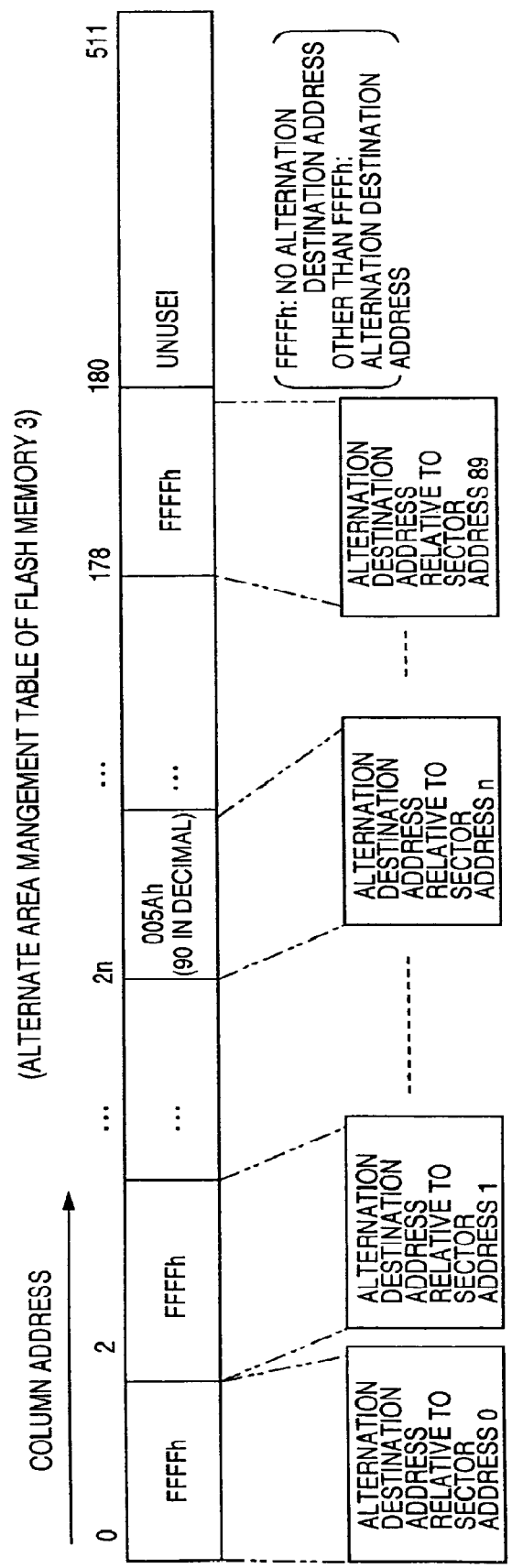
FIG. 6 is an explanatory view exemplarily showing the alternate area management table in the other of the flash memories.

Although not particularly limited, the alternation management area AreM has as an alternate area management, a defective registration data corresponding to the unit area BLK of the user data area AreU. Individual defective registration areas are alternation destination address information which specifies the address of the unit area of the alternation destination. An exemplary alternate area management table in the flash memory 2 is shown in, for example, FIG. 5. One defective registration data is 2 bytes. A defective registration data area is allocated to each sector address. The defective registration data is representative of that alternation is not necessary by FFFFh. The code of the alternation destination sector address is held when alternation is necessary. An example of FIG. 5 shows a case in which a defect in the sector address SA1 (1) of the flash memory 2 in FIG. 3 is alternated with the sector address SA1 (90). An example of FIG. 6 showing the alternation management table in the flash memory 3 shows a case in which a defect in the sector address SA2 (*n*) of flash memory 3 in FIG. 4 is alternated with the sector address SA (90). As is apparent from cases in FIGS. 5 and 6, the defective registration data one-to-one corresponds to the unit area BLK. Accordingly, corresponding defective registration data can be obtained by performing an address operation based upon the physical address of the unit area BLK.

The memory controller 5 makes alternative the storage area for each of the flash memories in which an access error occurs in an alternation control mode. Briefly, when one sector data is divided into even and odd bytes, which are dispersed to two flash memories 2 and 3, an alternate area management tables for alternation controls are provided for each of the flash memories 2 and 3. When an access error occurs, for example, in the even byte data of the sector data, the sector address of the even byte data in the flash memory 2 is alternated with other sector address of the alternate area and the original sector address of the flash memory 3 is allocated to the odd byte data in which no access error occurs. Since area management . for alternatively controlling the flash memories 2 and 3 is performed for each of the flash memories 2 and 3 in such a manner, alternate areas for defective address can be efficiently used, resulting in saving of storage area on alternation and extension of the service life of the memory card 1. In brief, if alternation of sector data units is conducted when one sector is dispersed through a plurality of flash memories 2 and 3, one alternate sector address is consumed for each of the flash memories 2 and 3, so that wasteful use of storage area is prevented.

Figure 7:
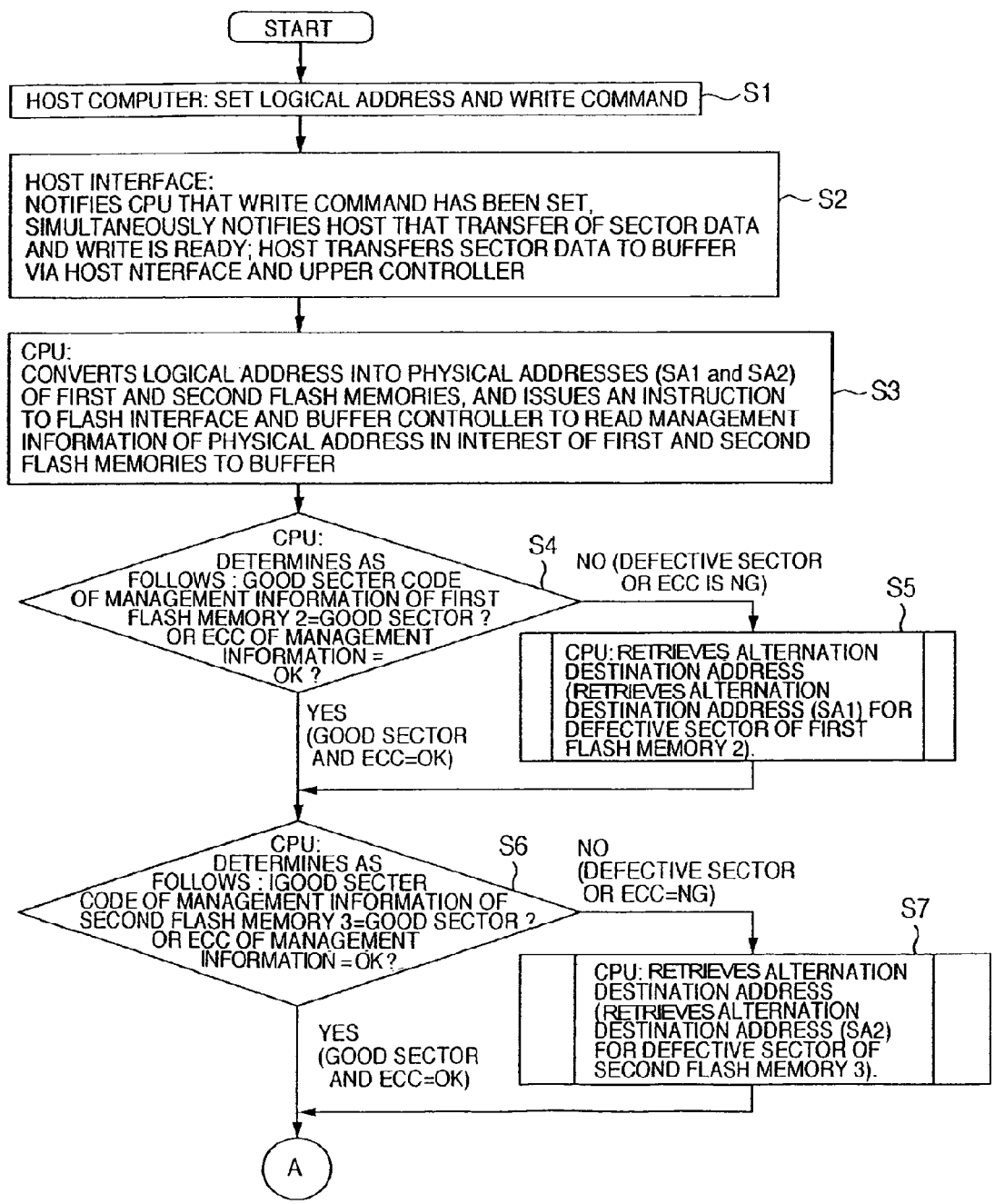
FIG. 7 is a flow chart exemplarily showing a part of a process of writing operation of sector data.
Figure 8:
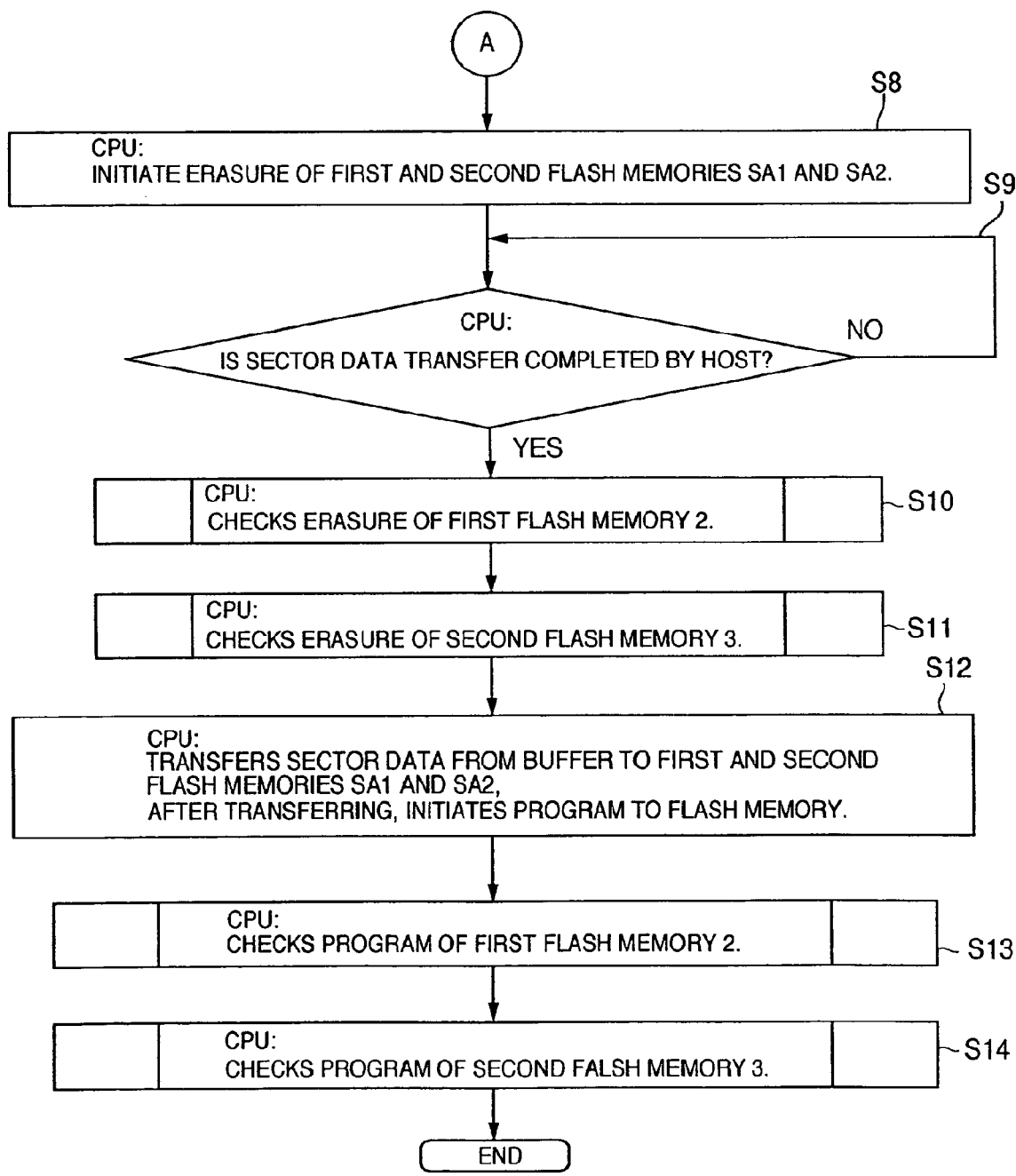
FIG. 8 is a flow chart exemplarily showing the remaining of the process of writing operation of sector data.

A process for writing sector data is exemplarily shown in FIGS. 7 and 8. When the host computer 6 issues a logical address and a write command to the memory card (S1), the host interface circuit 40 informs CPU of MPU 41 that the write command has be issued and informs the host computer 6 that preparation for input of the sector write data is completed (data entry ready state). This causes the sector data supplied from the host computer 6 to be input to the host interface circuit 40, so that the input sector write data is stored in the data buffer 4 via the buffer controller 43 (S2). CPU of MPU 41 converts the logical address which is provided from the host computer 6 into the sector addresses SA1, SA2 which are physical addresses of the flash memories 2 and 3, and causes reading of the management information of the management part PrtM of the sector addresses in interest SA1, SA2 via the flash interface circuit 42, and stores the read management information in the data buffer 4 via the buffer controller 43. When the ECC result for the management information of the stored sector address SA1 is OK, the CPU of MPU 41 determines based upon the good sector code contained in the management information of the sector address whether the sector in interest is good or not (S3). If a result of determination shows that it is a defective sector or an error which can not be corrected by ECC occurs (ECC=NG), retrieving of the alternation destination address is performed (S4). If a determination result shows that the sector is good or there is no error which can not be corrected by ECC (ECC=OK), then ECC of good sector code which is contained in the management information of the stored sector address SA2 and qualification of the sector in interest is determined (S6). If a determination result shows that it is a defective sector or an error which can not be corrected by ECC occurs (ECC=NG), then retrieving of the alternation destination address is performed (S7). The alternation destination sector address in interest will be referred to as sector address SA1 and SA2 for convenience also in case in which the sector addresses are alternated with other sector addresses.

Subsequently, CPU of MPU 41 initiates the erasing operation for the sector addresses SA1 and SA2 of the flash memories 2 and 3, respectively (S8). In parallel with the erasing operation, CPU of MPU 41 determines whether the write sector data has been transferred from the host computer 6 to the data buffer 4 (S9). CPU of MPU 41 performs an erasure check processing for respective flash memories 2 and 3 (S10 and S11). After erasure check processing, CPU of MPU 41 transfers write sector addresses SA1 and SA2, and write sector data, etc. from the data buffer 4 to the flash memories 2 and 3 via the buffer controller 43 and the flash interface circuit 42, and thereafter initiates a write (program) operation into the flash memories 2 and 3 (S12). CPU performs a program check for the flash memories 2 and 3 (S13 and S14) after initiation of the program operation.

Figure 9:
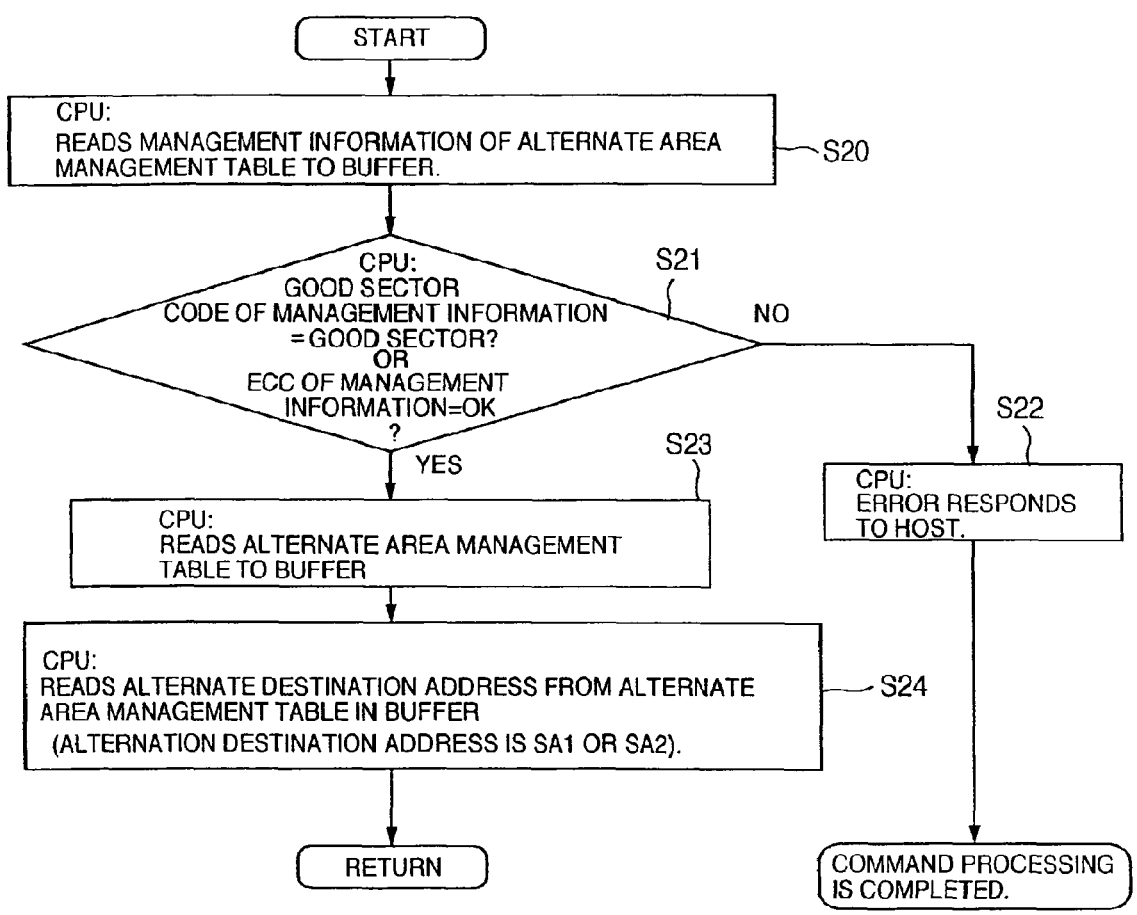
FIG. 9 is a flow chart exemplarily showing the process for relieving alternate destination address.

A process for retrieving an alternation destination address at S5, S7 is exemplarily shown in FIG. 9. Firstly, CPU of MPU 41 stores the management data of the alternation management area AreM of the flash memory which is an object of processing (flash memories 2 and 3 at steps S5 and S7, respectively into the data buffer 4 (S20). If an ECC result for the management data is OK, CPU determines based upon the good sector code contained in its management information whether the sector in interest is good or not (S21). If a determination result shows that the sector is defective or an error which can not be corrected by ECC occurs (ECC=NG), CPU notifies the host computer 6 of the error occurrence and completes the processing for the write command (S22). If a determination result shows that the sector is good and no occurrence of an error which can not be corrected by ECC (ECC=OK), CPU then stores the alternate area management table of the alternation management area AreA in interest in the data buffer 4 (S23). Then CPU reads the alternation destination address stored in corresponding area from the alternation management table stored in the data buffer 4 and adopts the read address as alternated sector address SA1 or SA2 (S24).

Figure 10:
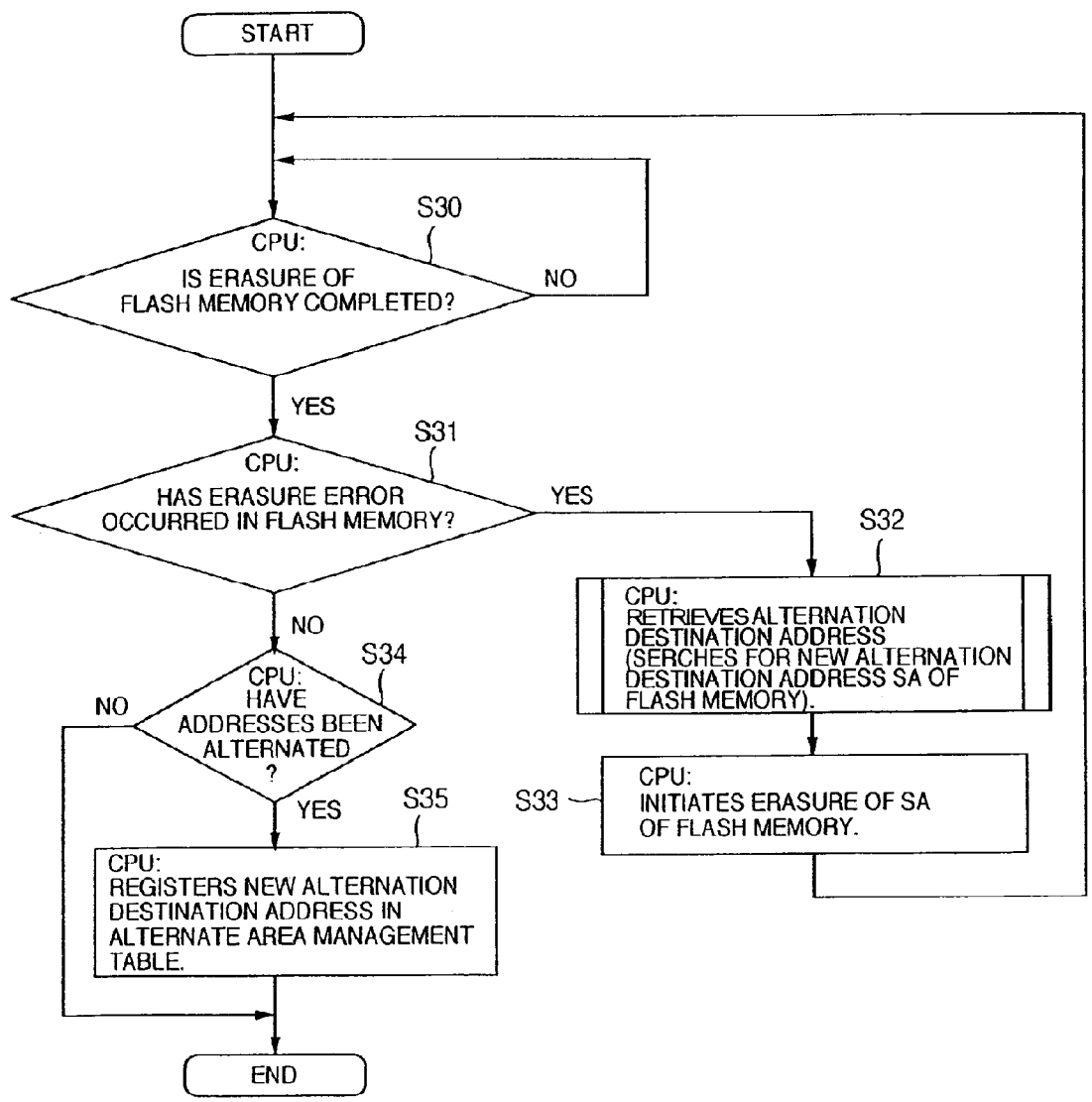
FIG. 10 is a flow chart showing the process for checking the erasure of the flash memory.

A process for erasure check of the flash memories at steps S10, S11 is exemplarily shown in FIG. 10. When the erasure operation is initiated, the flash memories 2(3) repeats verification for a predetermined period of time while applying an erasing voltage to a memory cell to be erased. CPU of MPU 41 determines whether the erasing operation of the flash memories 2(3) is completed or not (S30). A result of completion of the erasing operation shows a state in which all of the memory cells to be erased reach at a threshold voltage of erasing state or an erasing error state in which they do not reach it. CPU determines the result by reading the status register of the flash memory 2(3) (S31). On occurrence of an erasure error, CPU conducts alternation destination address retrieving (S32), initiates an erasing operation for the alternation destination sector address and returns to processing at step S30 again. On retrieving of the alternation destination address at step S32, CPU consecutively reads the management information of the alternate area AreR from lower sector address and makes firstly found vacant address an alternation destination address. If no erasing error occurs, CPU checks whether an alternation is occurs or not at steps S32 and S33 (S34). If an alternation is performed, CPU registers new alternation destination address in the alternative area managing table (S35). If no alternation occurs, CPU completes an erasing check processing.

Figure 11:
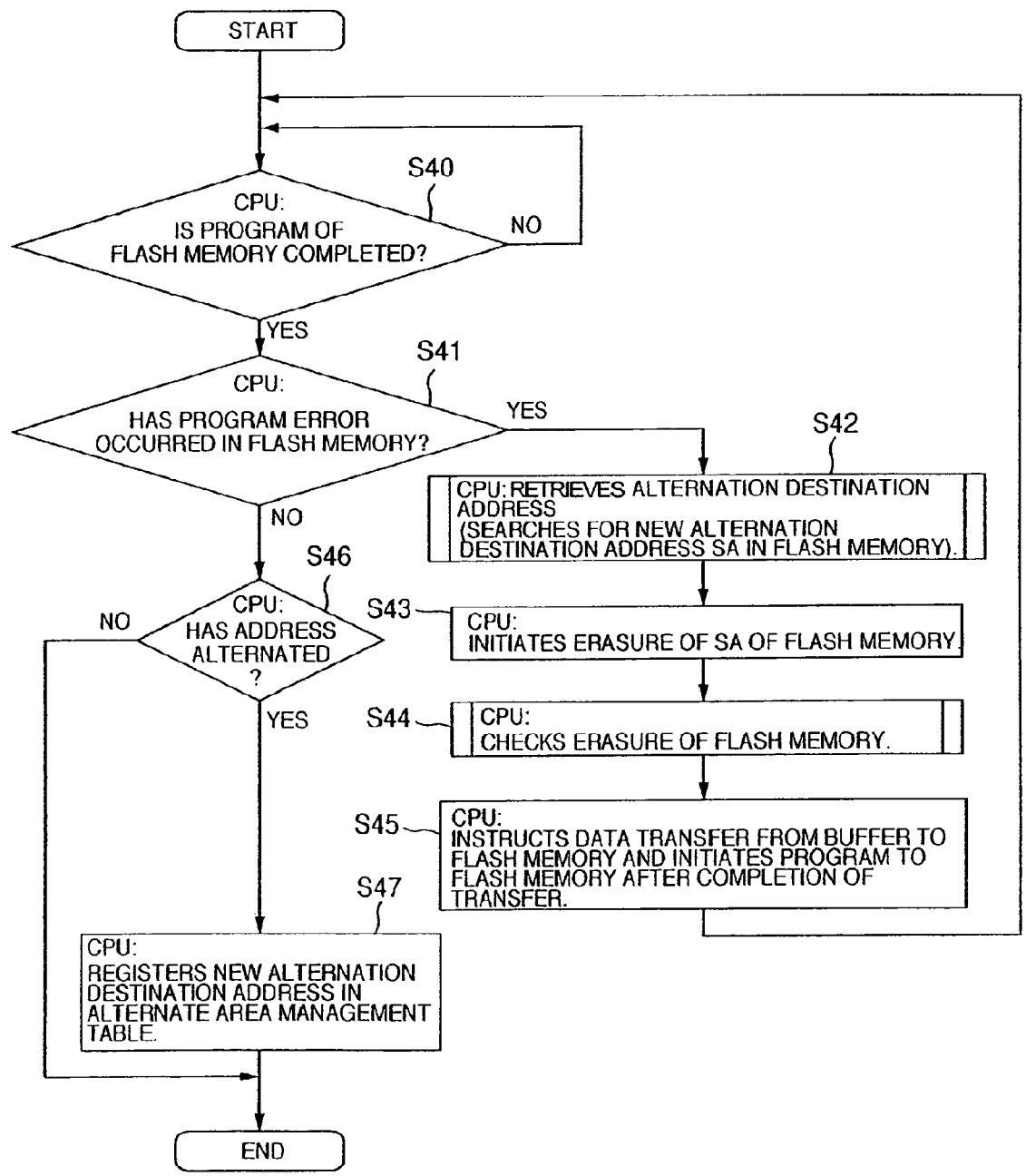
FIG. 11 is a flow chart showing the process for checking the program of the flash memory.

A process for checking the program of the flash memories at steps S13 and S14 is exemplarily shown in FIG. 11. When the program operation is initiated, the flash memory 2(3) repeats verification for a predetermined period of time while applying a write voltage to the memory cells which are to be programmed. CPU of MPU 41 determines whether the write operation is the flash memory 2(3) is completed or not (S40). A result of the completion of the program operation is a state in which all of the memory cells to be programmed reach a threshold voltage at which they have been written or a program error state in which they do not reach it. CPU determines the result by reading the status register of the flash memory 2(3) (S41). On occurrence of a program error, CPU conducts the retrieval of the alternation destination address retrieval (S42), initiates the erasing operation for the alternation destination sector address of the flash memory 2(3) for conducting the erasing check of FIG. 10 for the area to be erased (S44). The alternation destination address retrieving processing consecutively reads the management information of the alternate area AreR to determine vacant unit area BLK as the alternation destination address. When erasing checking is normally completed, CPU of MPU 41 again instructs to transfer the write sector data, etc. to the flash memory 2(3) from the data buffer 4 via the buffer controller 43 and the flash interface circuit 42 and thereafter initiates write (program) operation of the flash memory 2(3) (S45). Processing in CPU is returned to step 40 for the initiated program operation. After the program operation to the flash memory is normally completed (No at step 41), a determination whether or not an alternation has occurred at steps S42 through S45 is made (S46). If the alternation has been performed, new alternation destination address is registered in the alternation area management table (S47). If no alternation has been performed, the program checking processing is completed.

Figure 12:
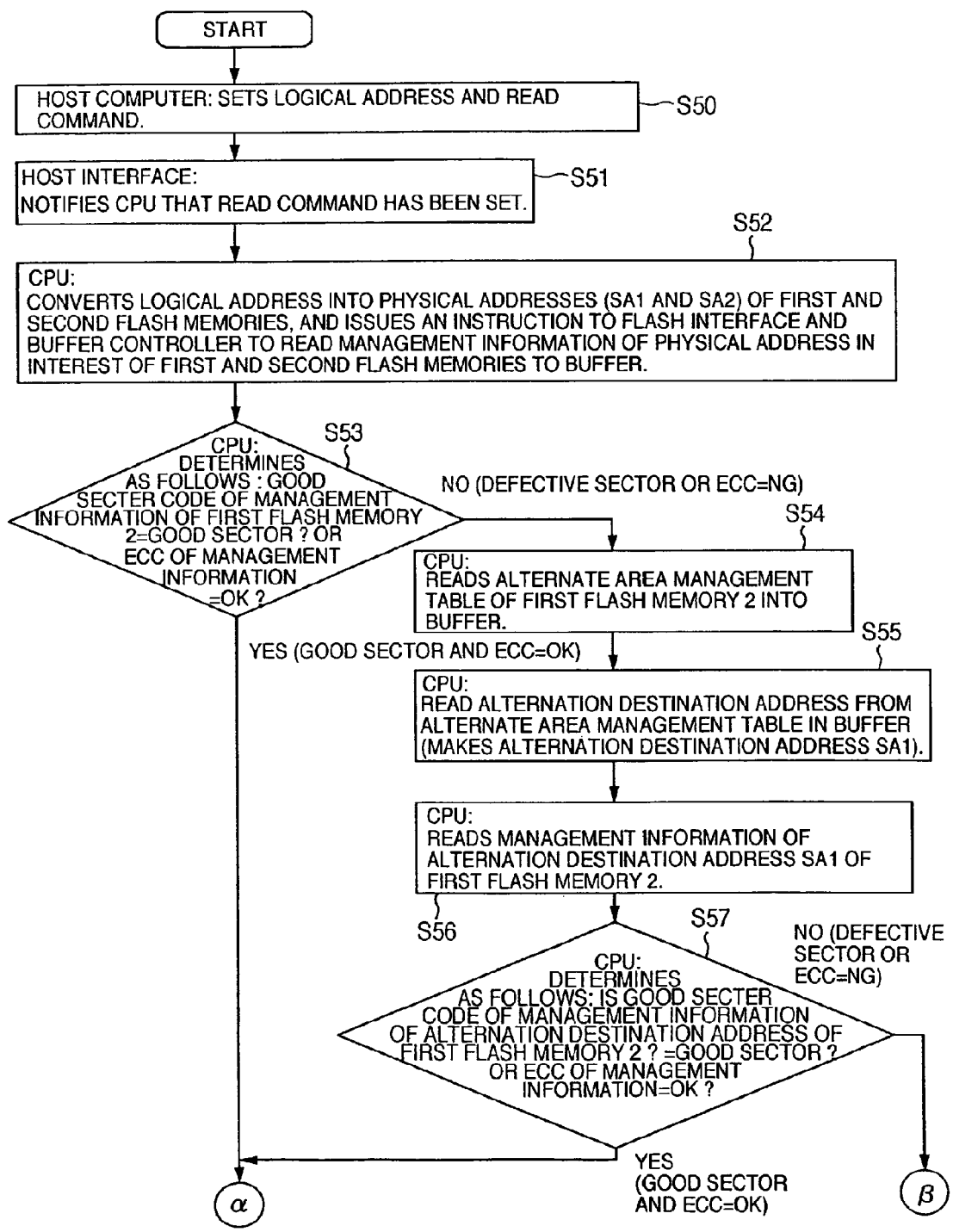
FIG. 12 is a flow chart showing a part of the process of the read operation of sector data which is performed by the host computer.
Figure 13:
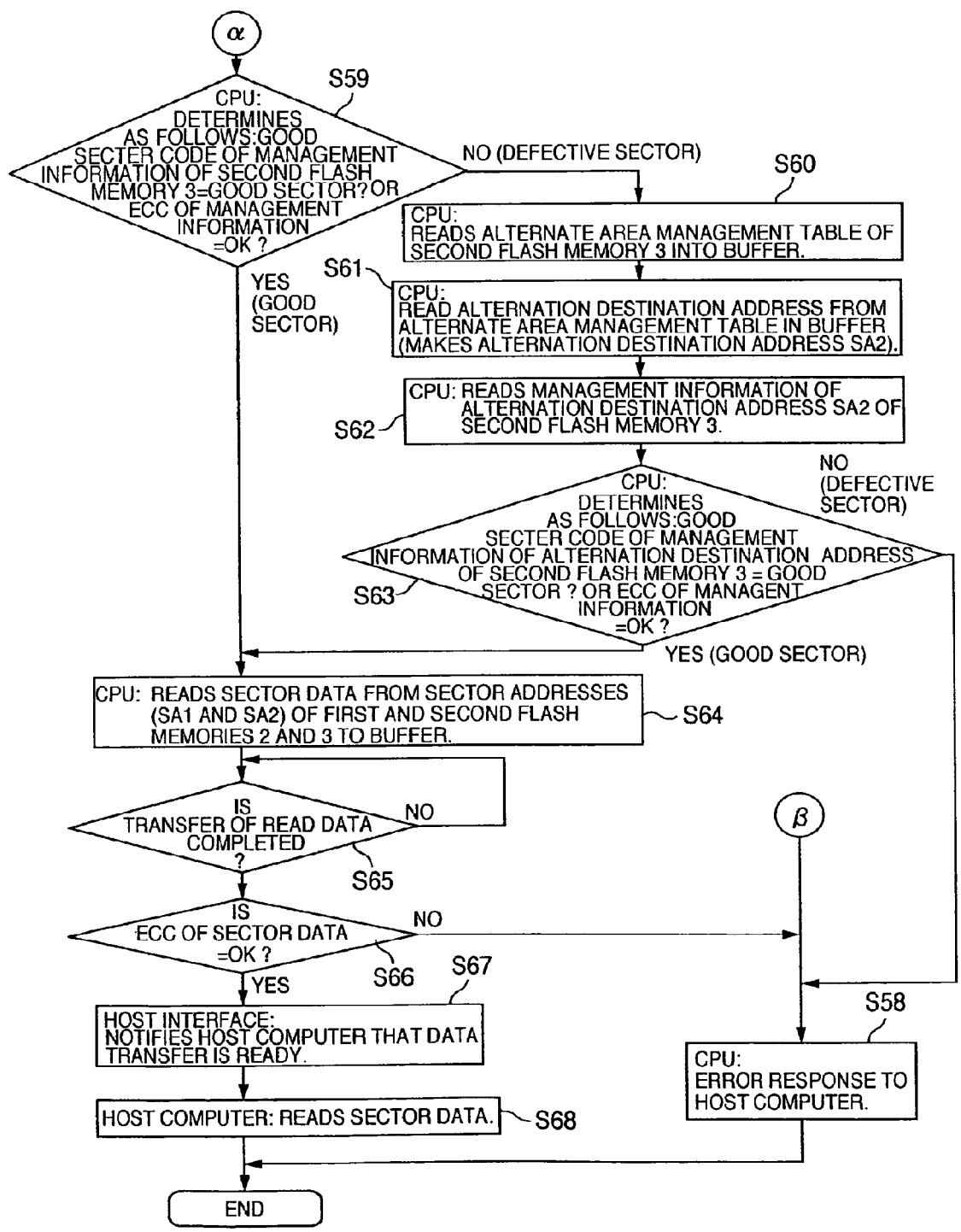
FIG. 13 is a flow chart showing the remaining of the process of the read operation of sector data which is performed by the host computer.

A process for reading the sector data by the host computer is exemplarily shown in FIGS. 12 and 13. When the host computer 6 issues a logical address and a read command to the memory card 1 (S50), the host interface circuit 40 informs CPU of MPU 41 that the read command has been issued (S51). CPU of MPU 41 converts the logical address provided from the host computer 6 into the sector addresses SA1 and SA2 which are the physical addresses of the flash memories 2 and 3, and reads the management information of the management part PrtM of the sector addresses in interest SA1 and SA2 via the flash interface circuit 42 for storing the read management information in the data buffer 4 via the buffer controller 43 (S52). If an ECC result for the management information of the stored sector address SA1 is OK, CPU of MPU 41 then determines based upon the good sector code contained in the management information of the sector address SA1 whether the sector in interest is good or not (S53). A determination result shows that the sector is defective or that an error which can not be corrected by ECC has occurred (ECC=NG), CPU stores the alternate area management table of the alternation management area AreM of the flash memory 2 in the data buffer 4 (S54). CPU reads the alternation destination address which is stored in corresponding area from the alternate area management table which is stored in the data buffer 4 and adopts the read address as the alternated sector address SA1 (S55). For the alternation destination sector address SA1, CPU stores the management information of the address SA1 in the data buffer 4 (S56). When the ECC result for the management information of the stored sector address SA1 is OK, CPU of MPU 41 then determines based upon the good sector code contained in the management information of the sector address SA1 whether the sector in interest is good or defective (S57). If a determination result shows that the sector is defective or an error which can not be corrected by ECC (ECC=NG), then CPU error-responds to the host computer 6 (S58) to complete the processing.

If a result of processing at step S53 or S57 shows that the sector is good or that an error which can not be corrected by ECC has not occurred (ECC=OK), the processing at steps S53 through S57 is performed (S59 to S63).

If a result of processing at steps S59 or S63 for the flash memory 3 shows that the sector is defective and ECC=OK, CPU of MPU 41 reads the sector data from the sector addresses SA1 and SA2 of respective flash memories 2 and 3 via the flash interface circuit 42 in a parallel manner and causes the ECC circuit 44 to execute the error detection and correction for the read data for storing the read data which has been subjected to error detection and correction in the data buffer 4 via the buffer controller 43 (S65). When CPU detects the completion of the transfer of the read data (S65), it determines whether or not an error has occurred in the sector read data (S66). If an ECC error has occurred, CPU error-responds to the host computer 6 to complete reading processing. If no EEC error has occurred, CPU notifies data transfer ready state to the host computer 6 via the host interface circuit 40 for outputting the sector data (S67). The host computer 6 reads the sector data (S68).

Figure 14:
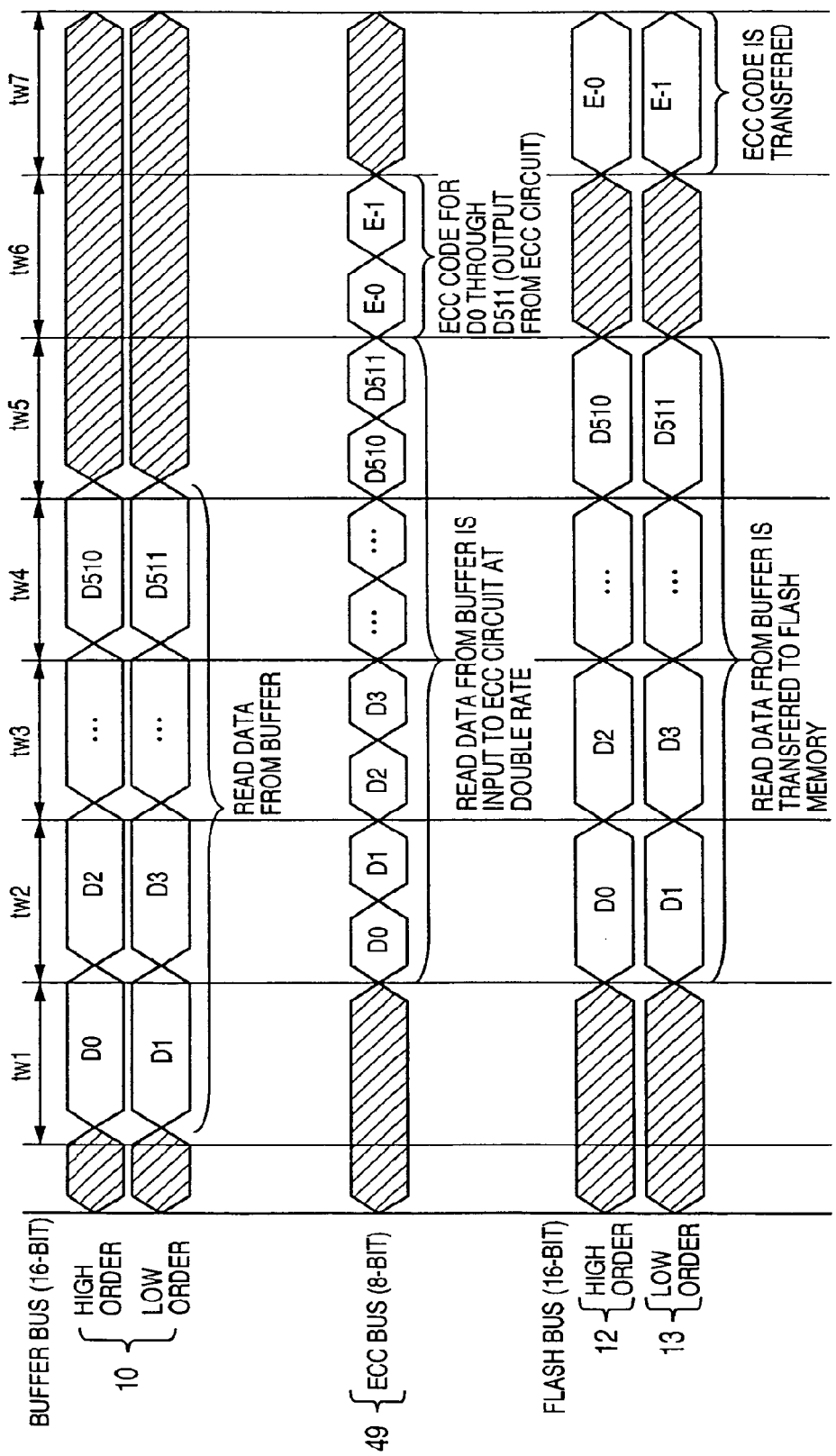
FIG. 14 is a timing chart showing the timing of transferring one piece of sector data from the data buffer to the flash memory.

A data transfer timing chart when one sector data is transferred from the data buffer to the flash memory is exemplarily shown in FIG. 14. The sector data is 512 bytes D0 through D511. Even bytes D0, D2, . . . , D510 are allocated to the high order 8-bits of the buffer bus, and odd bytes D1, D3, . . . , D511 are allocated to low order 8-bits of the buffer bus. The sector data which has been transferred from the data buffer 4 to the buffer controller 43 over the 16-bit buffer bus 10 is supplied to the ECC circuit 44. Since the bus of the ECC circuit has a width of 8 bits, each one byte is input to the ECC circuit 44 two times for one reading from the buffer. For example, the data of D0 and D1 which are read from the data buffer 4 at time tW1 are input to the ECC circuit at time tW2 in order of D0 and D1. The frequency of data transfer operations on the ECC bus 49 is double of that on the buffer bus 10. In parallel therewith, the sector data is also supplied to the flash memories 2 and, 3 from the flash interface circuit 42. Since the flash busses 12 and 13 are 16 bits like the buffer bus 10, the sector data is transferred to the flash memories at the same operation frequency as the data transfer operation frequency from the data buffer 4. When the reading of one data from the data buffer 4 is completed (tW4), and entry of one sector data into the ECC circuit 44 is completed (tW5), an ECC code for one sector data is generated in the ECC circuit 44. Finally, ECC code (E-0, E-1) is read out from the ECC circuit 44 (tW6), so that ECC code is transferred to the flash memories (tW7). The data transfer operation frequency when the ECC code generated in the ECC circuit 44 is supplied to the flash interface circuit 42 is similarly doubled. The ECC codes E-0 and E-1 are in parallel supplied to the flash memories 2 and 3 from the flash interface circuit 42.

Figure 15:
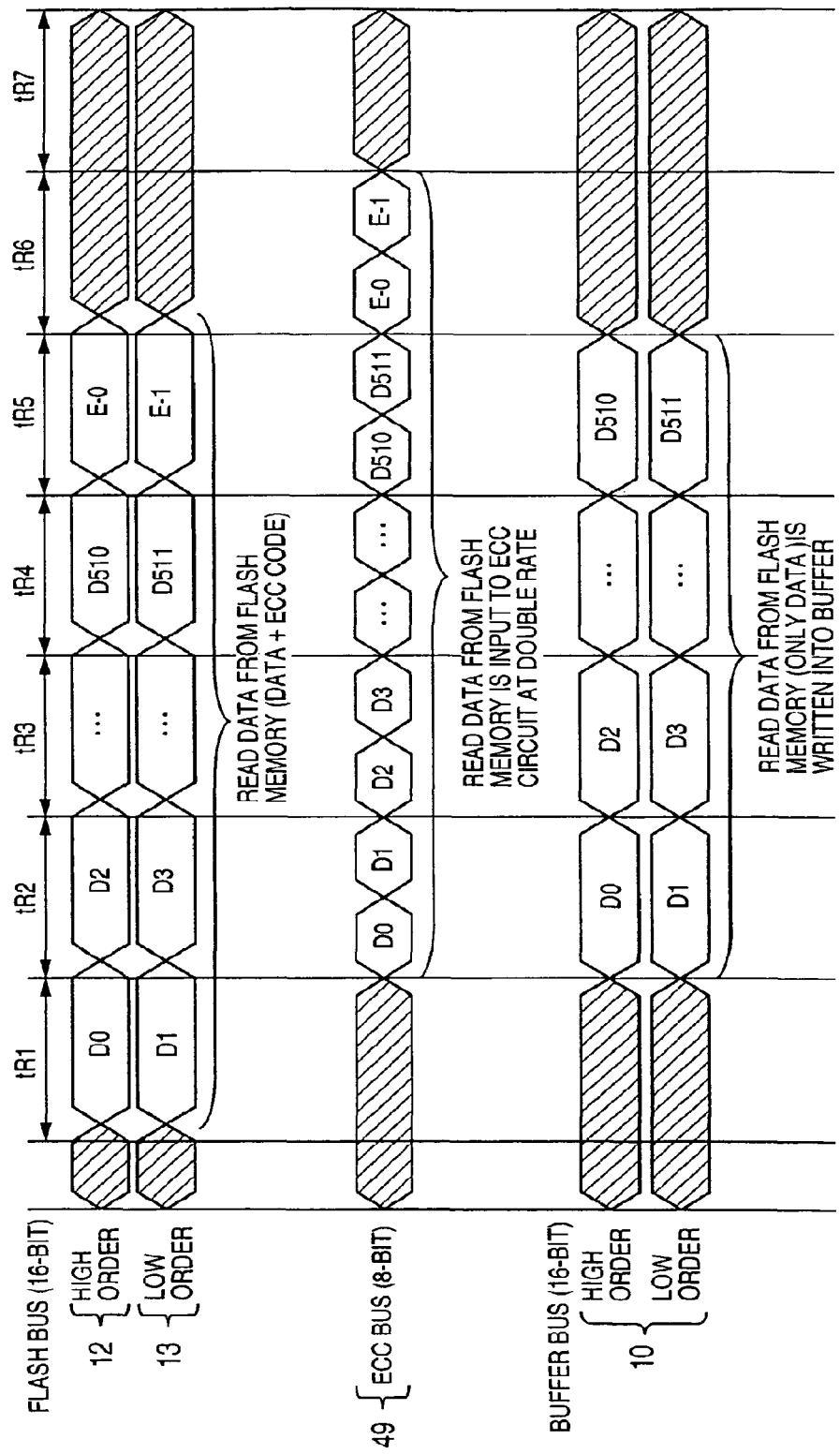
FIG. 15 is a timing chart showing the timing of transferring one piece of sector data from the flash memory to the data buffer.

A data transfer timing chart in which one sector data is transferred from the flash memory to the data buffer 4 is exemplarily shown in FIG. 15. The data D0, D1, ..., E-0, E-1 which have been read from the flash memories 2 and 3 to the flash busses 12 and 13 in parallel of 2 bytes are sequentially input to the ECC circuit 44 from the flash interface circuit 42 over the ECC bus 42 on a byte-by-byte basis. For example, the data D0 and D1 which have been read out from the flash memories 2 and 3 in cycle tR1 are input to the ECC circuit 44 in order of D0 and D1 in cycle tR2. The data which have been sequentially read from the flash memories 2 and 3 with 2 bytes being in parallel with each other are stored in the data buffer 4 over the buffer bus 10 so that 2 bytes are in parallel with each other. When the ECC code is transferred to the ECC circuit 44 in cycle tR6, error detection for the data read from the flash memories 2 and 3 is completed in the ECC circuit 44.

Since the data transfer operation frequency on the ECC bus 49 is double as high as that on the buffer bus 10 as is apparent from FIGS. 14 and 15, the operation of the ECC circuit 44 can follow the speeding up of the operation which is achieved by parallel access to the flash memories 2 and 3.

Figure 16:
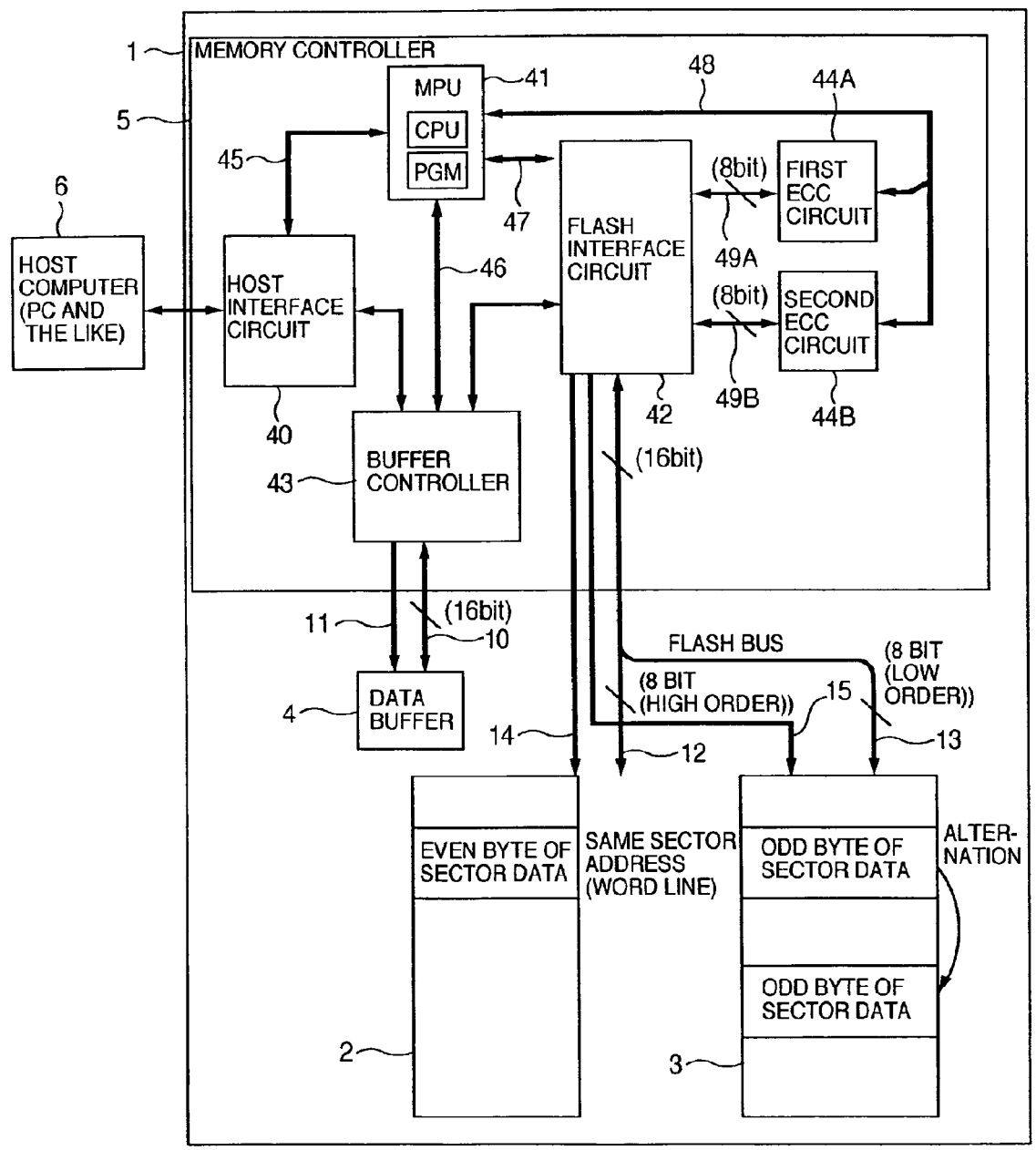
FIG. 16 is a block diagram showing a second embodiment of the memory card of the present invention.

A second example of the memory card of the present invention is shown in FIG. 16. A difference between the memory cards in FIGS. 1 and 16 is that the memory controller 5 has two ECC circuits 44A and 44B, and are connected to the flash interface circuit 42 via 8-bit ECC busses 49A and 49B, respectively. The first ECC circuit 44A generates an ECC code for the even byte data of the sector data which is stored in the first flash memory 2 on writing to the flash memory. On reading from the flash memory, error detection is conducted from the even byte data of the sector data read from the first flash memory 2 and the generated ECC code. If there is an error, error correction is conducted. Transfer of the sector data and the ECC code is conducted over the ECC bus 49A.

The second ECC circuit 44B generates an ECC code for the odd byte data of the sector data which will be stored in the second flash memory 3 on writing thereto. On reading from the flash memory, error detection is performed from the odd byte data of the sector data which is read from the second flash memory 3 and the generated ECC code. If there is an error, error correction is performed. The sector data and the ECC code is performed over the ECC bus 49B. Since other configuration is identical with that in FIG. 1, its detailed description will be omitted.

Figure 17:
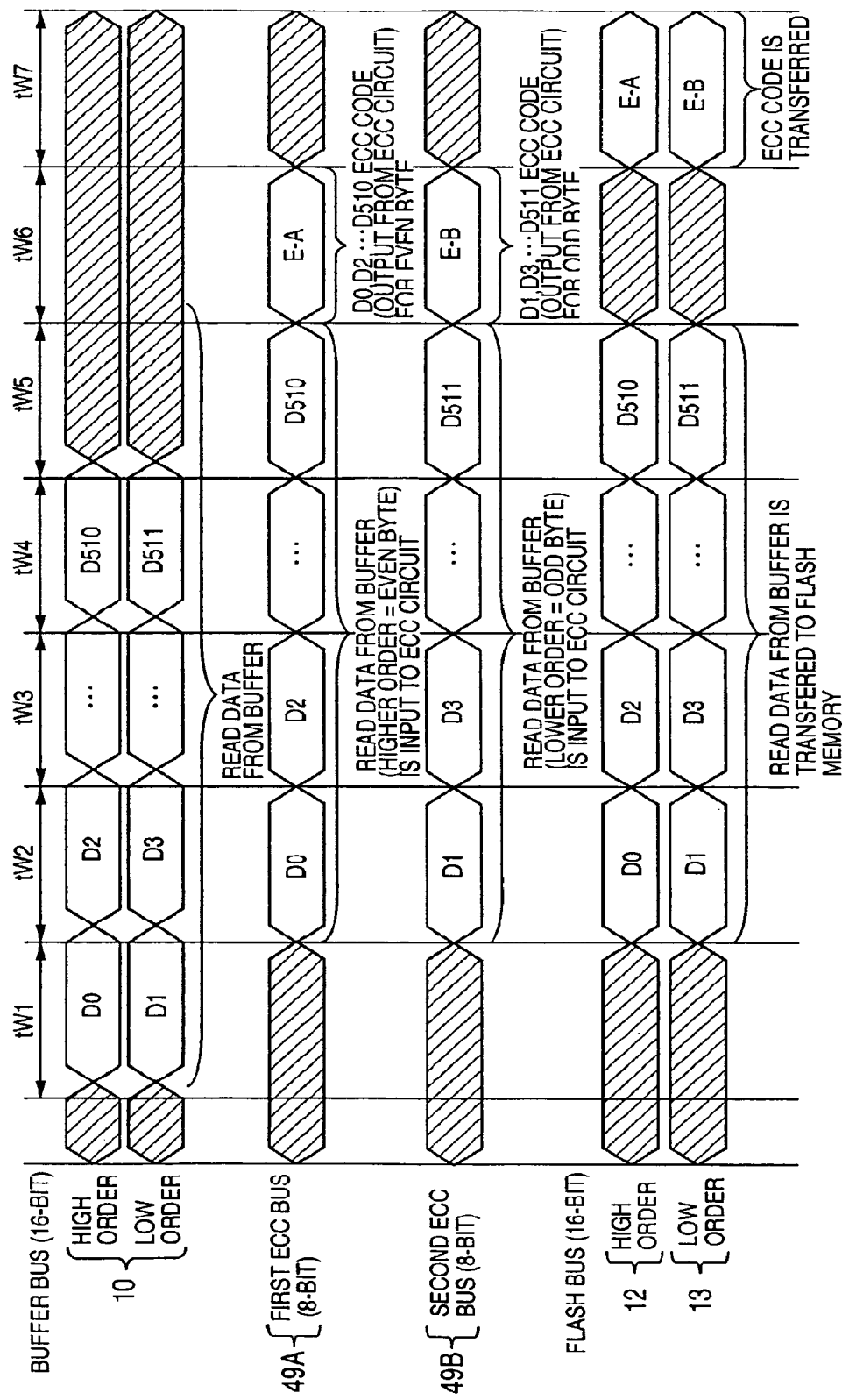
FIG. 17 is a timing chart showing the timing of transferring one piece of sector data from data buffer to the flash memory in the memory card of FIG. 16.

A timing chart of the operation for transferring one sector data to the flash memory from the data buffer in the memory card in FIG. 16 is exemplarily shown in FIG. 17.

The sector data is read out from the data buffer 4 to the buffer bus 10 so that 2 bytes are in parallel with each other. The even byte data D0, D2, ..., D510 which are read from the data buffer 4 are input to the first ECC circuit 44A from the first ECC bus 49A. Similarly, the odd byte data D1, D3, ..., D511 which are read from the data buffer 4 are similarly input to the second ECC circuit 44B from the second ECC bus 49B. In brief; it is not necessary to double the data transfer operation frequency on ECC bus 49A and 49B unlike FIG. 14. However, the hardware becomes double in scale. In the first ECC circuit 44A, an ECC code E-A for the even byte data of the sector data is generated. In the second ECC circuit 44B, an ECC code E-B for the odd byte data of the sector data is generated. The generated ECC code is supplied to the flash memories 2 and 3 over the flash busses 12 and 13 with 2 bytes being in parallel with each other after the sector data.

Figure 18:
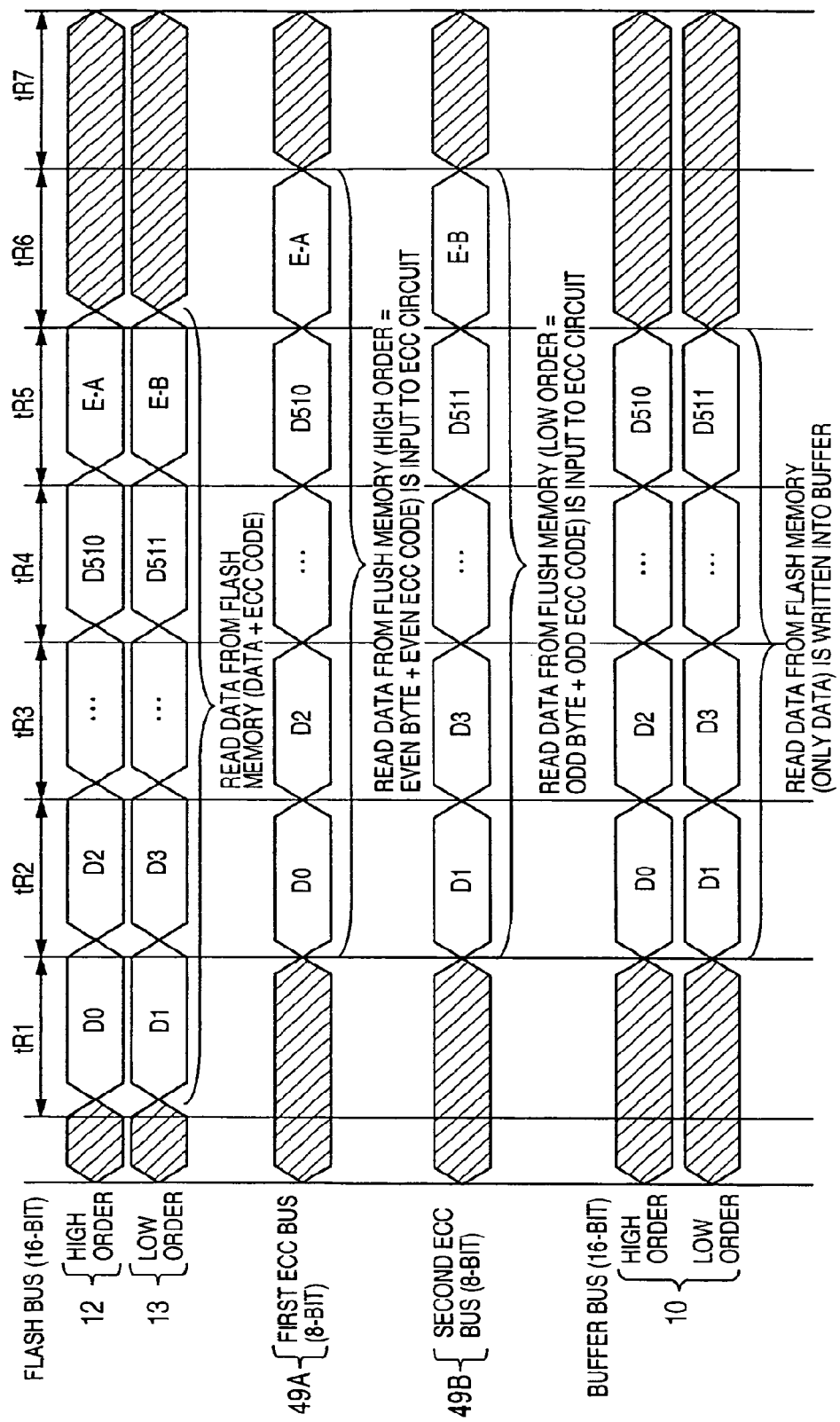
FIG. 18 is a timing chart showing the timing for transferring one piece of the sector data from the flash memory to the data buffer in the memory card of FIG. 16.

A timing chart of the operation for transferring one sector data from the flash memory to the data buffer in the memory card in FIG. 16 is exemplarily shown in FIG. 18. The sector data is read from flash memories 2 and 3 to the flash busses 12 and 13 with 2 bytes being in parallel with each other. The even byte data which has been read from the flash memories 2 is input to the first ECC circuit 44A over the first ECC bus 49A, so that error detection for the even byte data of the sector data is performed in the first ECC circuit 44A. Similarly the odd byte data which is read from the second flash memory 3 is input to the second ECC circuit 44B over the second ECC bus 49B, so that error detection from the odd byte data of the sector data is performed in the second ECC circuit 44B. The sector data which is read from the flash memories 2 and 3 are also stored in the data buffer 4 over the buffer bus 10 with 2 bytes being in parallel with each other.

Figure 19:
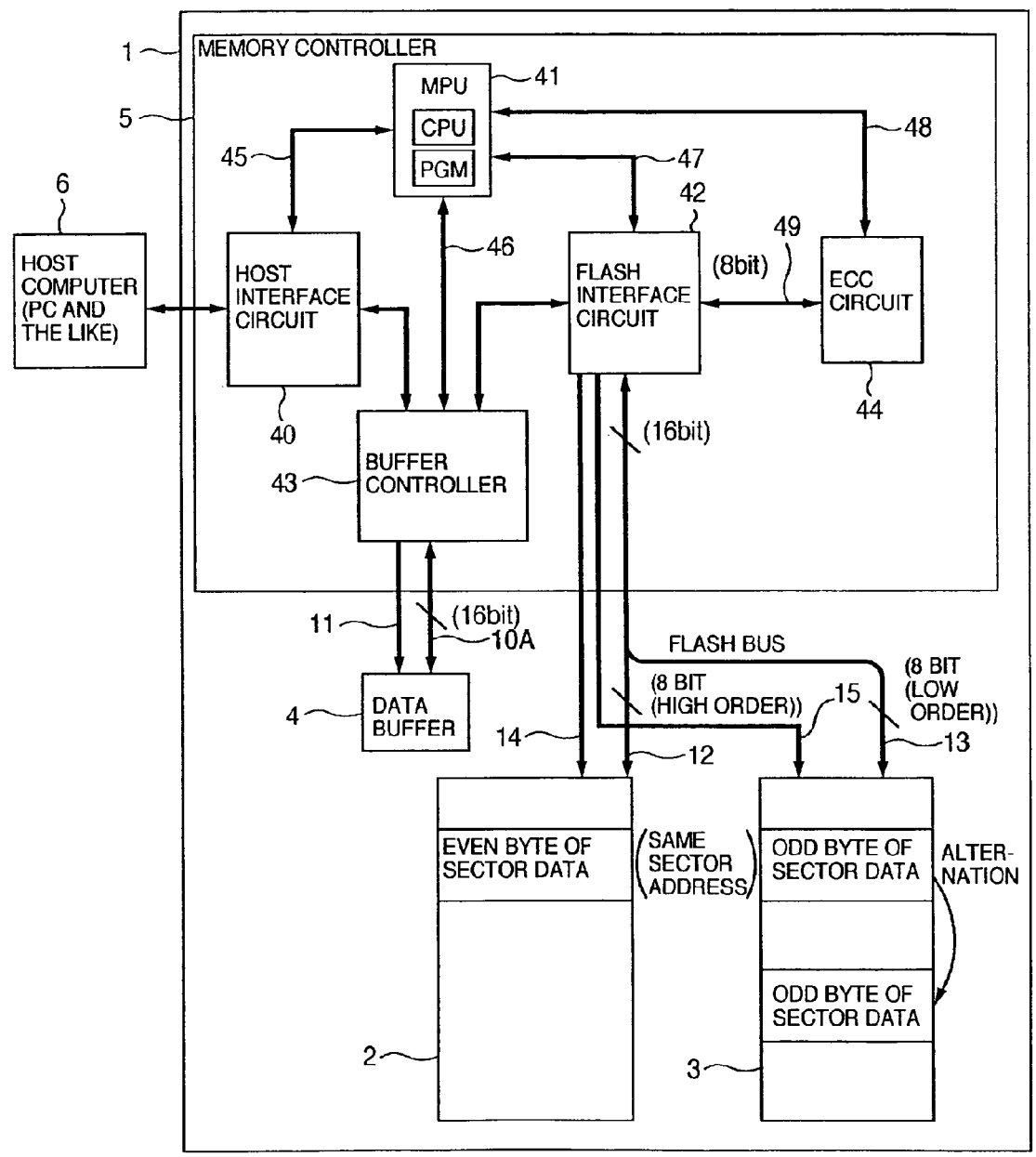
FIG. 19 is a block diagram showing a third embodiment of the memory card of the present invention.
Figure 20:
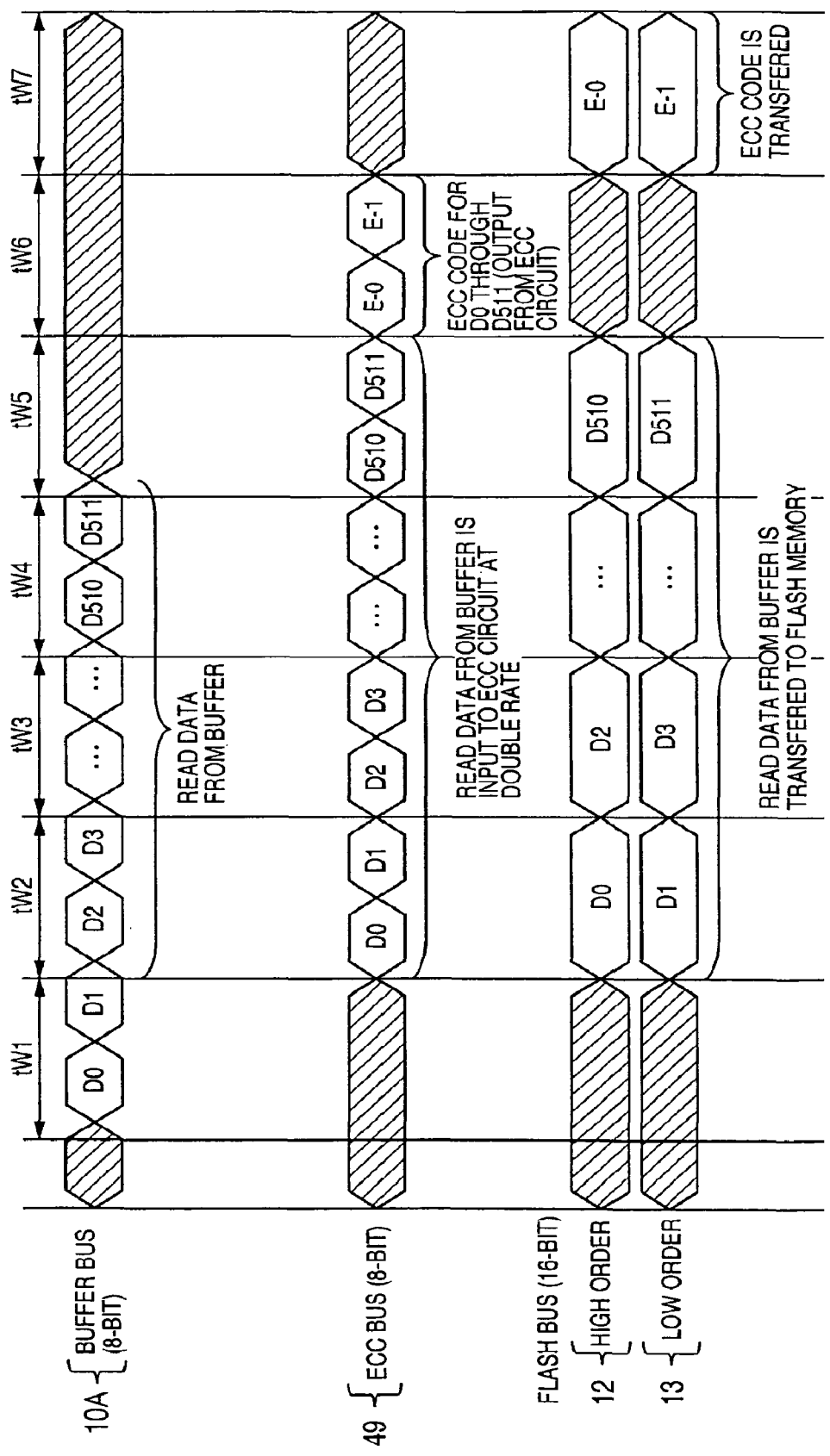
FIG. 20 is a timing chart showing the timing of transferring one piece of sector data from data buffer to the flash memory in the memory card of FIG. 19.

A third embodiment of the memory card of the present invention is shown in FIG. 19. The difference between the memory cards in FIGS. 1 and 19 resides in that the buffer bus 10A has a width of 8 bits. Since other configuration is identical with that in FIG. 1, detailed description thereof will be omitted.

Reading of data from the data buffer 4 to the buffer bus 10A is conducted at 8-bit width. The sector data which is read from the data buffer 4 is also input to the ECC circuit 44 from the ECC bus at 8-bit width, so that ECC codes E-0 and E-1 are generated. The sector data which are read from the data buffer 4 are delayed by one cycle so that the odd and even byte sector data are supplied to the flash memories 2 and 3 via high and low order flash busses 12 and 13 in a parallel manner, respectively. The data transfer operation frequency on the buffer bus 10A and ECC bus 49 each having 8-bit width is double as high as that on the flash buses 12 and 13 each having 16-bit width.

Figure 21:
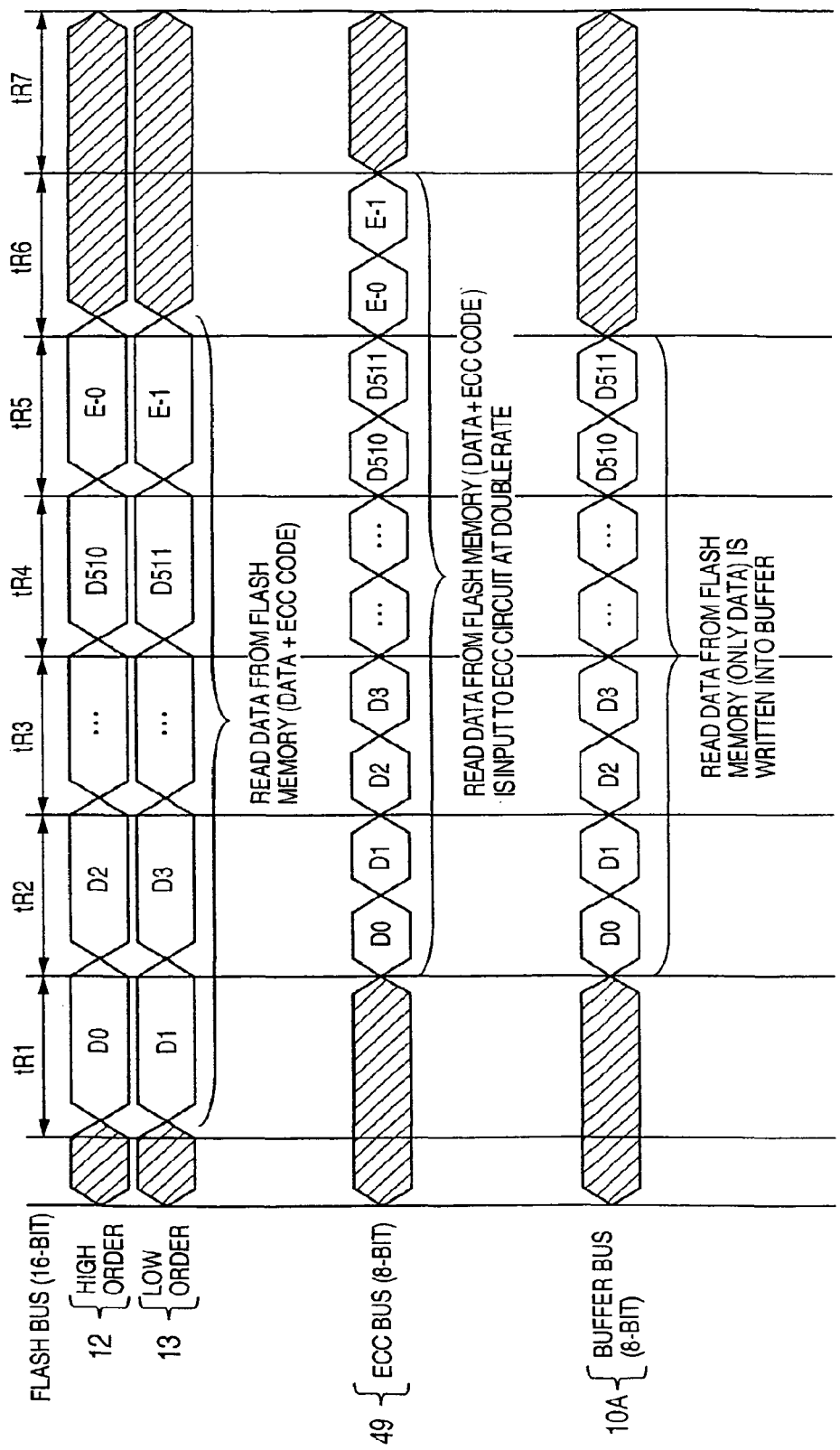
FIG. 21 is a timing chart showing the timing of transferring one piece of the sector data from the flash memory to the data buffer in the memory card of FIG. 19.

A timing chart of transferring of one sector data to the data buffer from the flash memory in the memory card of FIG. 19 is shown in FIG. 21. The sector data which has been read to the flash busses 12 and 13 from the flash memories 2 and 3 with bytes being in parallel with each other is supplied to the ECC circuit 44 over the 8-bit ECC bus 49 and is subjected to error detection therein. In parallel with this, the data transfer operation frequency on the buffer bus 10A and ECC bus 49 each having a 8-bit, width is double as high as that on the flash buses 12 and 13 each having a 16-bit width.

In accordance with the memory controller 5 of the above-mentioned memory card 1, the flash memory 2 is allocated to the storage area of the even byte data of the sector data and the flash memory 3 is allocated to the storage area of the odd byte data of the sector data. For access control of the flash memories which respond to an access command from the host computer 6, the controller 5 causes two flash memories 2 and 3 to perform the read and write operation in a parallel manner. The parallel access to the flash memories 2 and 3 in creases the data bus width between the memory controller 5 and the flash memories 2 and 3 or the number of the parallel bits of the data which are transferred in a parallel manner, so that speeding up of the data transfer between the flash memories 2 and 3 can be achieved.

The memory controller 5 enables storage areas for each flash memory in which an access error occurs in the alternation control. Accordingly, alternate areas can be efficiently used for defective addresses and wasteful use of the storage areas for alternation can be reduced. This contributes to extension of the service life of the memory card 1.

The ECC circuit 44, which the memory controller 5 of FIG. 1 comprises, conducts an input/output operation at an operation frequency which is double as high as that of the flash memories 2 and 3 operated for the parallel access. Accordingly, speeding up of the generation of the error code detection code and error detection and correction can be achieved without increasing the number of the ECC circuits 44. If the same number of the ECC circuit 44A and 44B as that of the flash memories 2 and 3 are provided as shown in FIG. 16, it suffices to conduct the ECC operation at an operation frequency equal to the input/output operation frequency of the flash memories 2 and 3 without the necessity to increase the operation frequency of the ECC circuit 44A and 44B. This enables the memory controller 5 to cause the operation of the ECC circuit to follow an increase in the efficiency of data transfer between the flash memories 2 and 3. When the main controller 5 accesses to a plurality of flash memories 2 and 3 in a parallel manner for reading data at a high rate, the operation of the ECC circuit 44 which conducts error detection and correction for the read data can be followed and the operation for generating an error detection code which is to be added to write data can be speeded up. Therefore, speeding up of the access operation as the whole of the memory card can be achieved.

Although present invention which was made by the inventors has been described in detail with reference to embodiments, the present invention is not limited thereto. It is to be understood that various modifications and alternations are possible without departing from the scope and spirit of the invention.

For example, a plurality of non-volatile memories are not limited to two flash memory chips. A term "one" does not only refer to physically one memory chip, but also a set of a plurality of memory chips. One set of flash memories is formed of 3 flash memory chips by connecting the data input/output terminals of the flash memory chips to data bus of, for example, 3n bits from low order bit side in unit of n bits. A plurality of non-volatile memories may be formed by adopting a plurality of such memory chip sets. The flash memories may be formed of 3 or more flash memory chips or 3 or more sets of flash memory chips. The non-volatile memory is not limited to the flash memory and may be high dielectric memory.

The number of bits of the flash bus, buffer bus and ECC bus is not limited to that in the above-mentioned embodiments, may be changed to an appropriate number.

The main controller is not limited to one chip. The MPU of the controller may comprise a separate chip. The main controller and data buffer may be formed on one semiconductor chip. The main controller, data buffer and flash memory may be formed on one chip.

The relationship of the access frequency and the number of data input/output terminals between the flash memory and the ECC circuit is not limited to the foregoing embodiments. The memory card can be formed so that the following relationship is satisfied. Each of a plurality of flash memories has input/output terminals having a first bit width W1, so that they can be accessed at an access frequency F1. The buses have a bit width of W1×m and are in parallel connected to input/output terminals of m flash memories. The ECC circuit is capable of detecting and correcting any error in the data of a bit width of W2. The operation frequency F2 of the ECC circuit satisfies a relationship: $F2 \geq (F1 \times W1 \times m)/(W2/n)$. This provides an effect and advantage that the operation of the ECC circuit can follow the increase in data transfer efficiency which is caused by parallel access with flash memories.

Advantages provided by the invention disclosed herein will be briefly described.

Since the memory controller causes the parallel access operation of the plurality of non-volatile memories in the access control of the non-volatile memory which is responsive to an external access instruction, the width of the data bus or the number of parallel bits of data transfer between the memory controller and the non-volatile memory can be increased, so that speeding up of the data transfer between the controller and the non-volatile memory can be achieved.

In an alternation control for alternating a storage are of a non-volatile memory in which an error occurs with other storage area, the memory controller makes alternative an storage area for each non-volatile memory in which an access error occurs. Accordingly, the alternate storage area for the defective address can be efficiently used and wasteful use of the storage area can be reduced on alternation. This contributes the extension of the service life of the memory card.

The data input/output operation frequency of the error detection and correction circuit is multiplied or the number of the error detection and correction circuits is increased for a configuration which enables parallel access to a plurality of non-volatile memories. When the main controller in parallel accesses to the plurality of non-volatile memories for reading data at a high rate, this modification enables the ECC circuit which conducts an error detection and correction to follow the read data. The generation of an error detection code which is to be added to write data can be speeded up. Speeding up of the access can be achieved as a whole of the memory card.

It should be further understood by those skilled in the art that the foregoing description has been made on embodiments of the invention and that various changes and modifications may be made in the invention without departing from the spirit of the invention and the scope of the appended claims.

The invention claimed is:
1. A memory apparatus comprising:
a plurality of flash memories;
a flash interface circuit; and
a one or more ECC circuits,
wherein the flash interface circuit controls operation of the plurality of flash memories;
the flash interface circuit performs an access control of the plurality of flash memories in response to an external access instruction, and an alternation control for substituting a storage area of an access error-related flash memory with another storage area;

each of the plurality of flash memories includes a plurality of sectors, the alternation control being performed individually for each of the plurality of flash memories;

the flash interface circuit causes the plurality of flash memories to operate for parallel access in the access control, and issues addresses, of which a first address is for a first flash memory and a second address is for a second flash memory;

the flash interface circuit controls issuing the addresses, such that the first address and the second address indicate same location sectors, when both of the sector of the first flash memory indicated by the first address and the sector of the second flash memory indicated by the second address are valid;

the flash interface circuit controls issuing the addresses, such that the first address and the second address indicate different location sectors, when the sector of the first flash memory indicated by the first address is valid and a sector of the second flash memory on same location of the sector of the first flash memory indicated by the first address is invalid;

the one or more ECC circuits add an error detection code to write-data written into the plurality of flash memories and conduct an error detection and correction for read-data from the plurality of flash memories, the one or more ECC circuits being as many as the number of the parallel access operations; and the one or more ECC circuits perform input/output operations in a parallel manner at an operation frequency which is equal to the input/output operation frequency of the parallel access operated flash memories.

2. A memory apparatus as defined in claim 1, further comprising buses for connecting respective flash memories to the flash interface circuit so that the respective flash memories are separately access-controlled.

* * * * *